(12) United States Patent
Iida et al.

(10) Patent No.: US 10,276,645 B2
(45) Date of Patent: Apr. 30, 2019

(54) IMAGE DISPLAY DEVICE AND METHOD FOR REPAIRING SHORT CIRCUIT FAILURE

(71) Applicant: Sony Corporation, Tokyo (JP)

(72) Inventors: Yukihito Iida, Kanagawa (JP);
Takayuki Taneda, Aichi (JP);
Katsuhide Uchino, Kanagawa (JP)

(73) Assignee: Sony Corporation (JP)

( * ) Notice: Subject to any disclaimer, the term of this patent is extended or adjusted under 35 U.S.C. 154(b) by 2 days.

(21) Appl. No.: 15/254,510

(22) Filed: Sep. 1, 2016

(65) Prior Publication Data
US 2016/0372536 A1 Dec. 22, 2016

Related U.S. Application Data

(63) Continuation of application No. 14/559,091, filed on Dec. 3, 2014, now Pat. No. 9,501,977, which is a (Continued)

(30) Foreign Application Priority Data
Feb. 4, 2009 (JP) ................ P2009-023220

(51) Int. Cl.
*H01L 27/32* (2006.01)
*H01L 51/56* (2006.01)
(Continued)

(52) U.S. Cl.
CPC ....... *H01L 27/3276* (2013.01); *G09G 3/3233* (2013.01); *G09G 3/3266* (2013.01);
(Continued)

(58) Field of Classification Search
CPC ................ H01L 27/3276; H01L 51/56; H01L 2251/5392; H01L 2251/568;
(Continued)

(56) References Cited

U.S. PATENT DOCUMENTS

| 5,075,674 A | 12/1991 | Katayama et al. |
| 6,522,079 B1 | 2/2003 | Yamada |

(Continued)

FOREIGN PATENT DOCUMENTS

| JP | 62-092994 A | 4/1987 |
| JP | 1-134342 A | 5/1989 |

(Continued)

OTHER PUBLICATIONS

Japanese Office Action for JP Application No. 20117017599, dated Jun. 20, 2015.
(Continued)

*Primary Examiner* — Aneeta Yodichkas
(74) *Attorney, Agent, or Firm* — Lerner, David, Littenberg, Krumholz & Mentlik, LLP

(57) ABSTRACT

The present invention relates to an image display device and a method for repairing a short circuit failure. The present invention is applicable to, for example, an active matrix type image display device using an organic EL device, and a short circuit location between wiring patterns is able to be repaired. In a scanning line WSL or a signal line DTL, a bypass wiring pattern BP for bypassing a region where the signal line DTL and the scanning line WSL intersect with each other is provided. By using the bypass wiring pattern BP, a short circuit location between wiring patterns is repaired.

13 Claims, 29 Drawing Sheets

Related U.S. Application Data continuation of application No. 13/145,604, filed as application No. PCT/JP2009/066605 on Sep. 25, 2009, now Pat. No. 8,913,091.

(51) Int. Cl.
  *G09G 3/3233* (2016.01)
  *G09G 3/3266* (2016.01)

(52) U.S. Cl.
  CPC ..... *H01L 51/56* (2013.01); *G09G 2300/0814* (2013.01); *G09G 2330/08* (2013.01); *H01L 2251/5392* (2013.01); *H01L 2251/568* (2013.01)

(58) Field of Classification Search
  CPC ............... G09G 3/3266; G09G 3/3233; G09G 2300/0814; G09G 2330/08
  See application file for complete search history.

(56) References Cited

U.S. PATENT DOCUMENTS

| | | | |
|---|---|---|---|
| 7,768,485 | B2 | 8/2010 | Uchino et al. |
| 2003/0067458 | A1 | 4/2003 | Anzai |
| 2008/0068307 | A1 | 3/2008 | Kawabe |
| 2009/0058764 | A1 | 3/2009 | Imai |
| 2009/0115708 | A1* | 5/2009 | Sagawa ............... H01L 27/3276 345/76 |
| 2009/0167645 | A1 | 7/2009 | Kishi |
| 2010/0109989 | A1 | 5/2010 | Itsumi et al. |
| 2010/0188384 | A1 | 7/2010 | Uchino et al. |

FOREIGN PATENT DOCUMENTS

| | | |
|---|---|---|
| JP | 7-013197 A | 1/1995 |
| JP | 2002-184992 A | 6/2002 |
| JP | 2003-050400 A | 2/2003 |
| JP | 2003-248439 A | 9/2003 |
| JP | 2007-310311 A | 11/2007 |
| JP | 2008281828 | 11/2008 |
| WO | 2009001578 A1 | 12/2008 |

OTHER PUBLICATIONS

Korean Office Action for KR Application No. 1020117017599, dated Jun. 20, 2015.
Office Action from Chinese Application No. 2009-80155670.8, dated Jul. 21, 2014.

* cited by examiner

ND METHOD
IMAGE DISPLAY DEVICE AND METHOD FOR REPAIRING SHORT CIRCUIT FAILURE

CROSS-REFERENCE TO RELATED APPLICATIONS

The present application is a continuation of U.S. application Ser. No. 14/559,091, filed on Dec. 3, 2014 which is a continuation of U.S. application Ser. No. 13/145,604, filed on Jul. 21, 2011, which is a National Stage Filing of International Application No. PCT/JP2009/066605, filed on Sep. 25, 2009, which claims the benefit of Japan Application No. P2009-023220, filed on Feb. 4, 2009, the disclosures of which are incorporated herein by reference.

TECHNICAL FIELD

The present invention relates to an image display device and a method for repairing a short circuit failure, and is able to be applied to, for example, an active matrix type image display device using an organic EL (Electroluminescence) device. According to the present invention, a short circuit location between wiring patterns is able to be repaired by providing a scanning line with bypass wiring pattern for bypassing a region where a signal line and the scanning line intersect with each other.

BACKGROUND ART

In recent years, an active matrix type image display device using an organic EL device has been actively developed. The image display device using the organic EL device is an image display device using light emitting phenomenon of an organic thin film that emits light by being applied with an electric field. The organic EL device is able to be driven at an applied voltage of 10 [V] or less. Thus, in this kind of image display device, the electric power consumption is able to be decreased. Further, the organic EL device is a self-luminous device. Thus, this kind of image display device does not need a backlight unit, and accordingly weight saving and thickness saving are able to be realized. Further, the organic EL device has a characteristic that the response speed is high, about several µ second. Accordingly, this kind of image display device has a characteristic that a residual image is hardly generated at the time of displaying videos.

Specifically, in the active matrix type image display device using the organic EL device, pixel circuits composed of the organic EL device and a drive circuit for driving the organic EL device are arranged in a state of matrix, and thereby a display section is formed. This kind of image display device displays a desired image by driving the respective pixel circuits by a signal line drive circuit and a scanning line drive circuit arranged around the display section respectively through a signal line and a scanning line provided in the display section.

For the image display device using the organic EL device, a method of configuring the pixel circuit by using two transistors is disclosed in Patent Document 1. According to the method, a configuration of the image display device is able to be simplified. Further, in the Patent Document 1, a structure to prevent threshold voltage variation and mobility variation of a drive transistor for driving the organic EL device and image quality deterioration with age of characteristics of the organic EL device is disclosed.

SUMMARY OF THE INVENTION

In the meantime, in this kind of image display device, there is a possibility that a short circuit failure occurs between wiring patterns provided in the display section due to a defect in a manufacturing process. Examples of this kind of defect include a defect in a photolithography step, a defect in an etching step, and adherent conductive foreign matter.

If this kind of short circuit failure is able to be repaired in the manufacturing process of the image display device, the yield is able to be further improved.

In view of the foregoing problem, it is an object of the invention to provide an image display device in which a short circuit location between wiring patterns is able to be repaired and a method for repairing a short circuit failure in the image display device.

An image display device of the present invention displays a desired image with the use of a display section in which pixel circuits are arranged in a state of matrix. Regarding a scanning line or a signal line of the display section, a wiring pattern is formed in the same layer as that of a wiring pattern of the signal line or the scanning line in regions except for a region where the wiring pattern intersects with the signal line or the scanning line. In the intersection region, the wiring pattern is formed in a layer different from that of the wiring pattern of the signal line or the scanning line. The scanning line is provided with a bypass wiring pattern that passes over the wiring pattern of the signal line in an upper layer or a lower layer in a region different from the intersection region, and that bypasses the intersection region.

A method for repairing a short circuit failure of the present invention is applied to the image display device of the present invention. The intersection region is separated from the bypass wiring pattern by cutting the scanning line, and thereby a short circuit failure between the signal line and the scanning line is repaired.

When the wiring pattern of the scanning line or the signal line is formed from the wiring in the same layer as that of the wiring pattern of the signal line or the scanning line in regions except for the region where the wiring pattern intersects with the signal line or the scanning line, and in the intersection region, the wiring pattern of the scanning line or the signal line is formed from wiring in a layer different from that of the wiring pattern of the signal line or the scanning line, it is possible that the signal line and the scanning line are arranged by preferentially using the wiring in the same layer side, and the signal line or the scanning line is arranged in a different layer only in a region where the same layer wiring is not able to be applied to both the signal line and the scanning line. Thus, a wiring pattern layer with small sheet resistance is applied to the same layer side, and thereby impedance of the scanning line and the signal line is able to be decreased. However, in this case, since the signal line and the scanning line are formed in the same layer, a short circuit failure easily occurs between the signal line and the scanning line. In particular, since the signal line and the scanning line are layered in the region where the signal line and the scanning line intersect with each other, it is difficult to remove only the region where the signal line and the scanning line are shorted, and as a result, the short circuit failure is not able to be repaired.

Accordingly, in the image display device of the present invention, the scanning line is provided with the bypass wiring pattern that passes over the signal line in an upper layer or a lower layer of the signal line in the region different from the intersection region, and that bypasses the intersection region. The bypass wiring pattern bypasses the intersection region. Thus, in the case where the intersection region is separated from the scanning line by trimming, the bypass wiring pattern transmits a signal of the scanning line instead of the scanning region. Thereby, the short circuit location between the scanning line and the signal line generated in the intersection region is able to be repaired.

According to the present invention, short circuit locations between wiring patterns are able to be repaired.

DESCRIPTION OF EMBODIMENTS

A description will be hereinafter given of embodiments of the present invention with reference to the drawings. In addition, the description will be given in the following order.
1. First embodiment (example that a bypass wiring pattern is included)
2. Second embodiment (example that signal lines of adjacent pixel circuits are opposed to each other)
3. Third embodiment (example that a writing transistor is arranged under a signal line)
4. Fourth embodiment (example that a writing transistor is arranged under a signal line in the second embodiment)
5. Fifth embodiment (example that a scanning line side is arranged in a layer under a signal line)
6. Sixth embodiment (example that a pseudo wiring pattern is included)

1. First Embodiment (1) Configuration
(1-1) Whole Configuration (FIG. 2 to FIG. 13)

Figure 2:
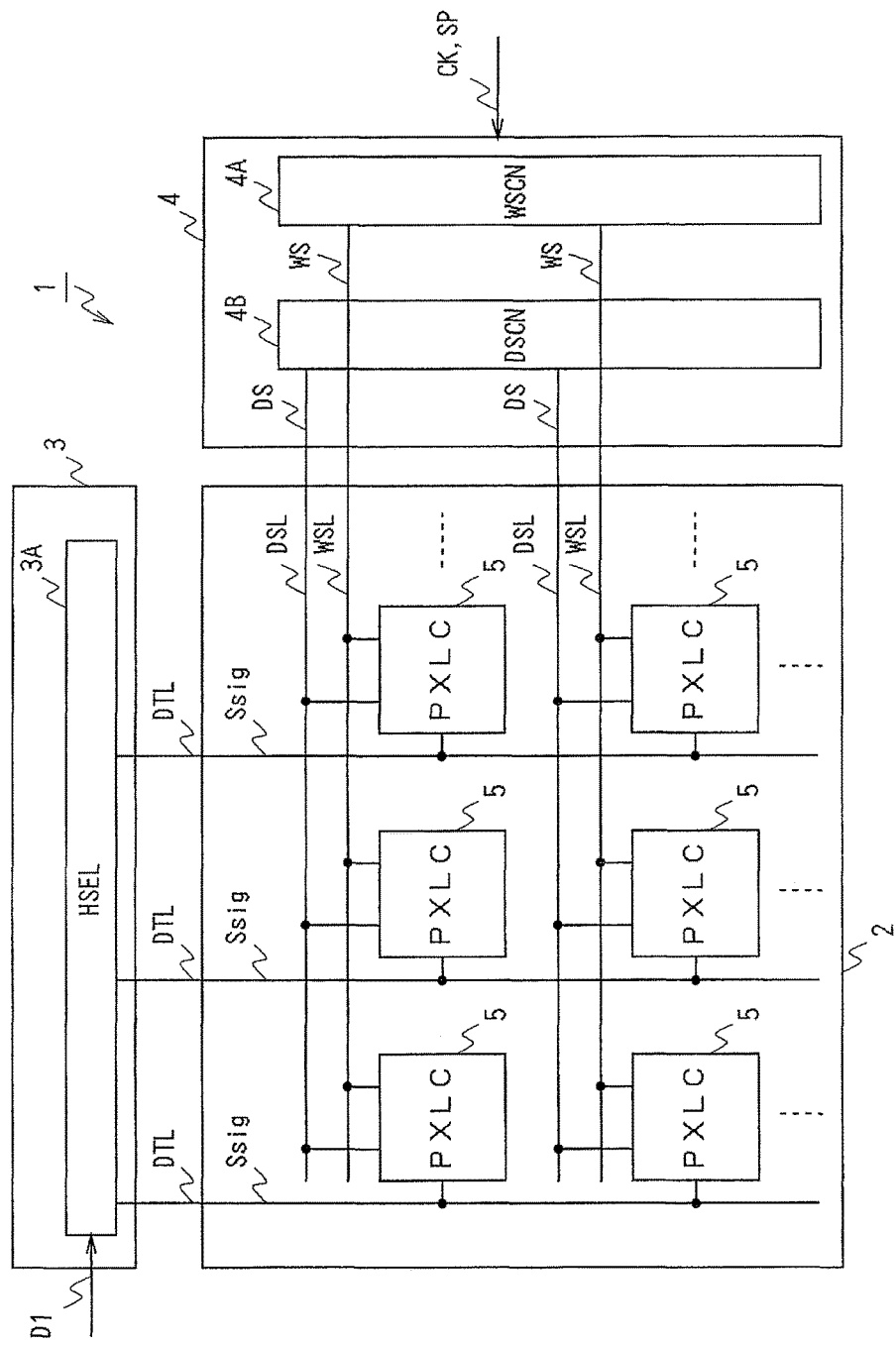
FIG. 2 is a block diagram illustrating a configuration of the image display device.

FIG. 2 is a block diagram illustrating an image display device of this embodiment. An image display device 1 has a display section 2 on an insulating substrate made of glass or the like, and includes a signal line drive circuit 3 and a scanning line drive circuit 4 around the display section 2.

The display section 2 is formed by arranging pixel circuits (PXCL) 5 in a state of matrix. The signal line drive circuit 3 outputs a drive signal Ssig for a signal line to a signal line DTL provided in the display section 2. Specifically, with the use of a horizontal selector (HSEL) 3A, the signal line drive circuit 3 sequentially latches image data D1 inputted in the order of raster scanning, sorts the image data D1 into each signal line DTL, and executes digital analog conversion process, respectively. The signal line drive circuit 3 processes the digital analog conversion result and generates the drive signal Ssig. Thereby, the image display device 1 sets tone of the respective pixel circuits 5 by, for example, so-called line sequence.

The scanning line drive circuit 4 outputs a writing signal WS and a drive signal DS respectively to a scanning line WSL for a writing signal and a scanning line DSL for an electric power source provided in the display section 2. The writing signal WS is a signal for on/off controlling a writing transistor provided in the respective pixel circuits 5. The drive signal DS is a signal for controlling a drain voltage of a drive transistor provided in the respective pixel circuits 5. The scanning line drive circuit 4 processes a given sampling pulse SP with the use of clock CK and generates the writing signal WS and the drive signal DS respectively in a writing scanning circuit (WSCN) 4A and a drive scanning circuit (DSCN) 4B.

Figure 3:
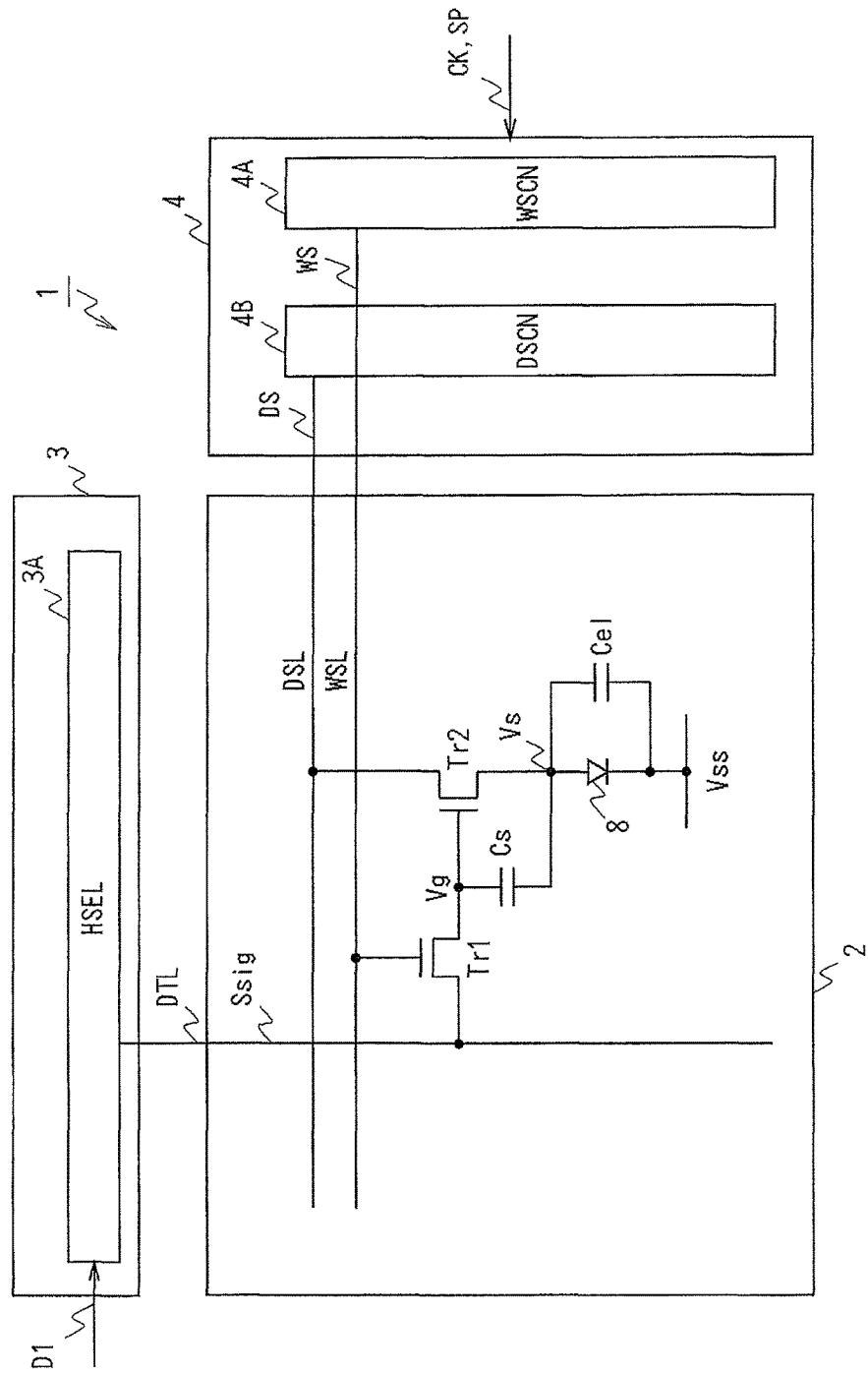
FIG. 3 is a connection diagram illustrating a configuration of the pixel circuit in detail.
Figure 4:
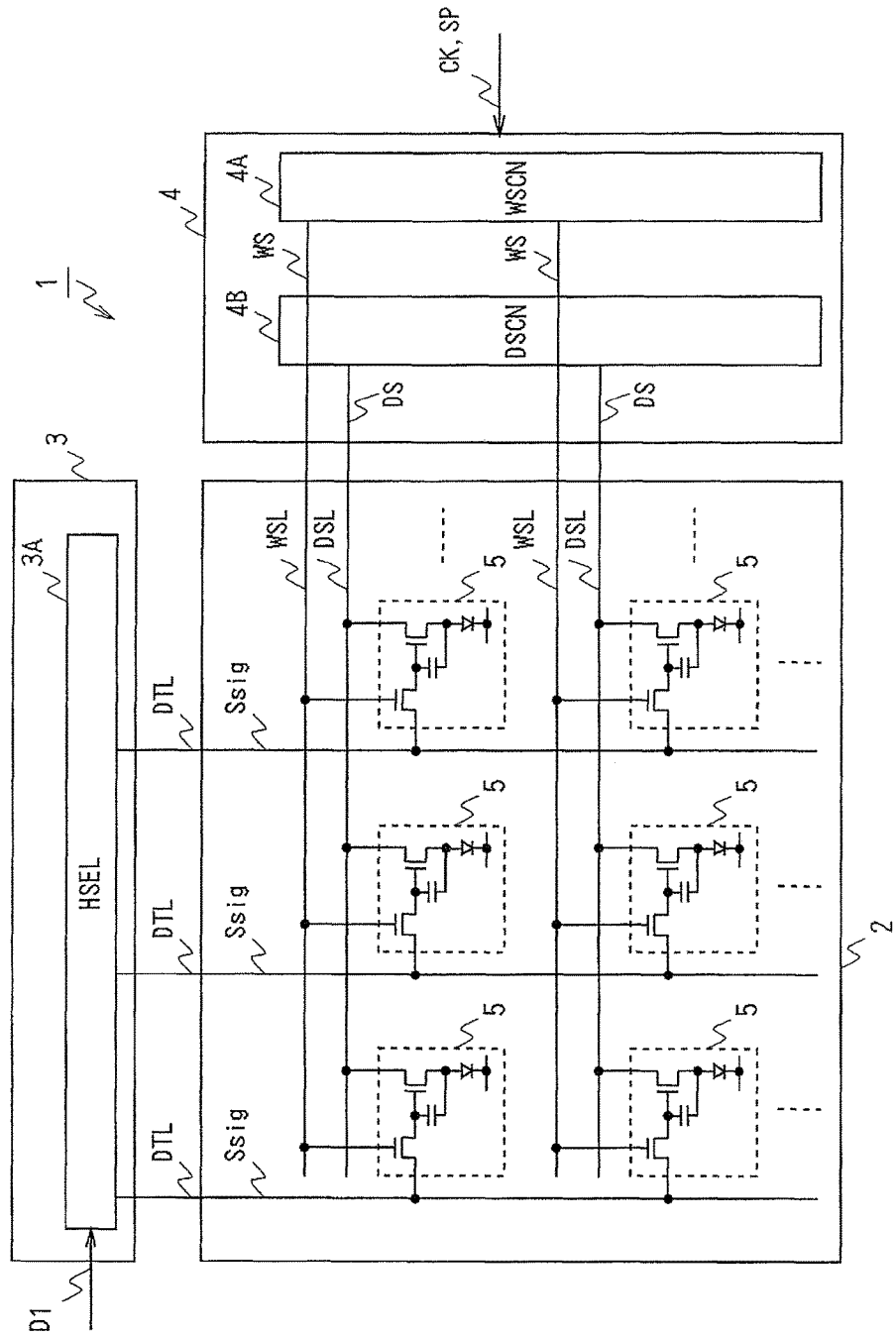
FIG. 4 is a connection diagram illustrating the display section of FIG. 2 in contrast with FIG. 3.

FIG. 3 illustrates a detailed configuration of the pixel circuit 5. As illustrated in FIG. 4 in contrast with FIG. 3, the display section 2 is formed by arranging the pixel circuits 5 illustrated in FIG. 3 in a state of matrix. In the pixel circuit 5, a cathode of an organic EL device 8 is connected to a given anode-side electric power supply Vss, and an anode of the organic EL device 8 is connected to a source of a drive transistor Tr2. The drive transistor Tr2 is an N-channel type transistor composed of, for example, a TFT. A drain of the drive transistor Tr2 is connected to the scanning line DSL for the electric power source, and the drive signal DS for the electric power source is supplied from the scanning line drive circuit 4 to the scanning line DSL. Based on the foregoing structure, in the pixel circuit 5, the organic EL device 8 is current-driven by using the drive transistor Tr2 having a source follower circuit configuration.

A retentive capacity Cs is provided between the gate and the source of the drive transistor Tr2. A gate side end voltage of the retentive capacity Cs is set to a voltage of the drive signal Ssig by the writing signal WS. In the result, in the pixel circuit 5, the organic EL device 8 is current-driven by the drive transistor Tr2 by a gate-to-source voltage Vgs according to the drive signal Ssig. A capacity Cel is a floating capacity of the organic EL device 8. In the following description, the capacity Cel is sufficiently larger than the retentive capacity Cs, and a parasitic capacity of a gate node of the drive transistor Tr2 is sufficiently smaller than the retentive capacity Cs.

In the pixel circuit 5, the gate of the drive transistor Tr2 is connected to a signal line DTL through a writing transistor Tr1 that prosecutes on/off action by the writing signal WS. The writing transistor Tr1 is an N-channel type transistor composed of, for example, a TFT. The signal line drive circuit 3 switches a tone setting voltage Vsig and a correction voltage Vo for a threshold voltage at given timing, and outputs the drive signal Ssig. The correction fixed voltage Vo is a fixed voltage used for variation correction of the threshold voltage of the drive transistor Tr2. The tone setting voltage Vsig is a voltage that indicates luminance of the organic EL device 8, and has a value obtained by adding the fixed voltage Vo for correcting the threshold voltage to a tone voltage Vin. The tone voltage Vin is a voltage corresponding to the luminance of the organic EL device 8. In the horizontal selector (HSEL) 3A, the image data D1 inputted in the order of raster scanning is sequentially latched and sorted into each signal line DTL, and is subsequently provided with digital analog conversion process respectively. Accordingly, the tone voltage Vin is generated for every signal line DTL.

Figure 5:
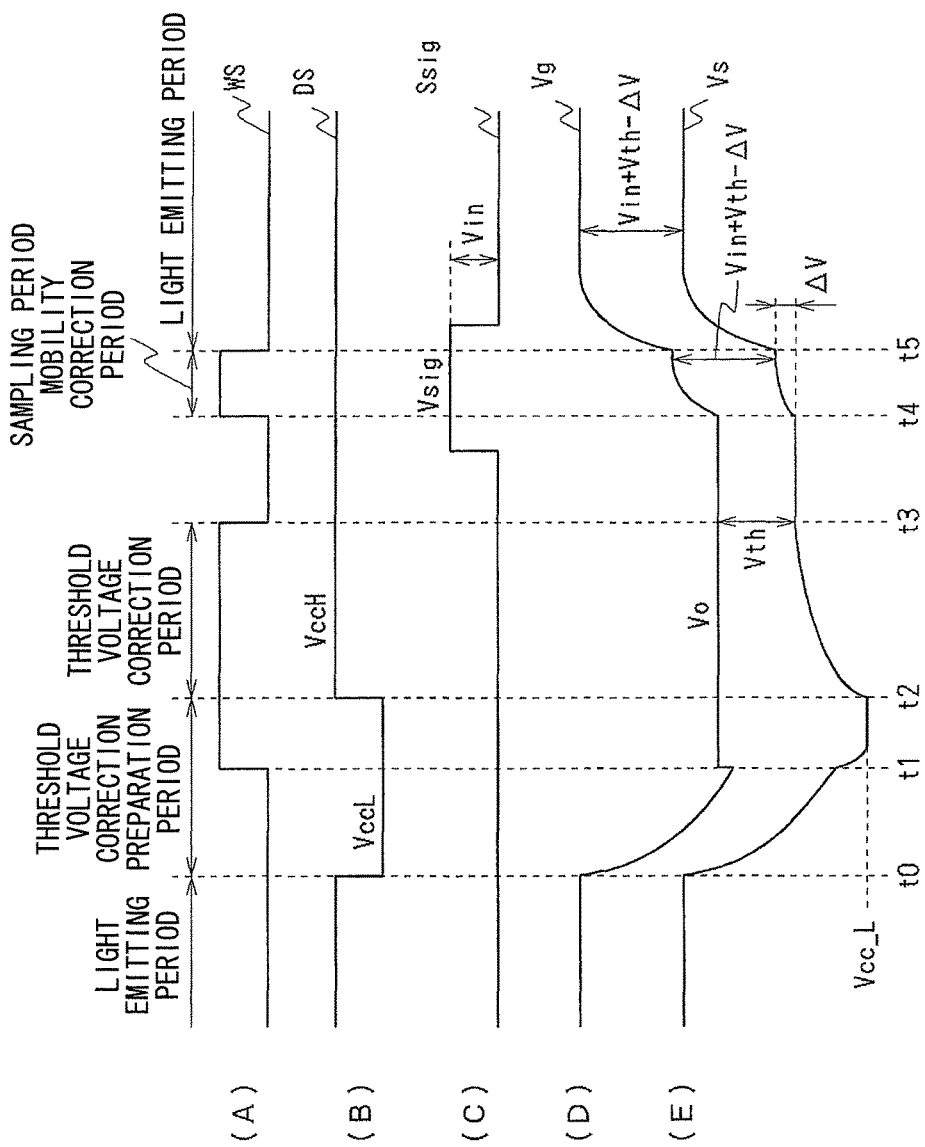
FIG. 5 is a timing chart for explaining operation of the pixel circuit of FIG. 3.
Figure 6:
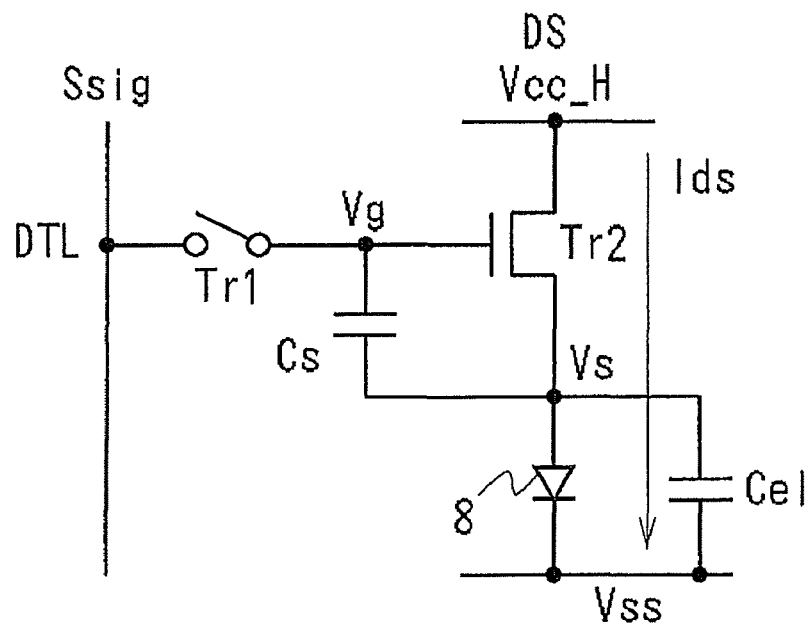
FIG. 6 is a connection diagram as well.

In the pixel circuit 5, as illustrated in FIG. 5, the writing transistor Tr1 is set to off state by the writing signal WS during the period in which the organic EL device 8 emits light (FIG. 5(A)). Further, in the pixel circuit 5, during the light emitting period, an electric power source voltage VccH is supplied to the drive transistor Tr2 by the drive signal DS for the electric power source (FIG. 5(B)). Thereby, as illustrated in FIG. 6, the pixel circuit 5 makes the organic EL device 8 emit light by a drive current Ids according to the gate-to-source voltage Vgs (FIGS. 5(D) and 5(E)) of the drive transistor Tr2 as an interterminal voltage of the retentive capacity Cs during the light emitting period.

In timing t0 at which the light emission period is finished, the drive signal DS for the electric power source is fallen down to a given fixed voltage VccL (FIG. 5(B)). The fixed voltage VccL is a voltage sufficiently low to make the drain of the drive transistor Tr2 function as a source, and is a voltage lower than a cathode voltage Vss of the organic EL device 8.

Figure 7:
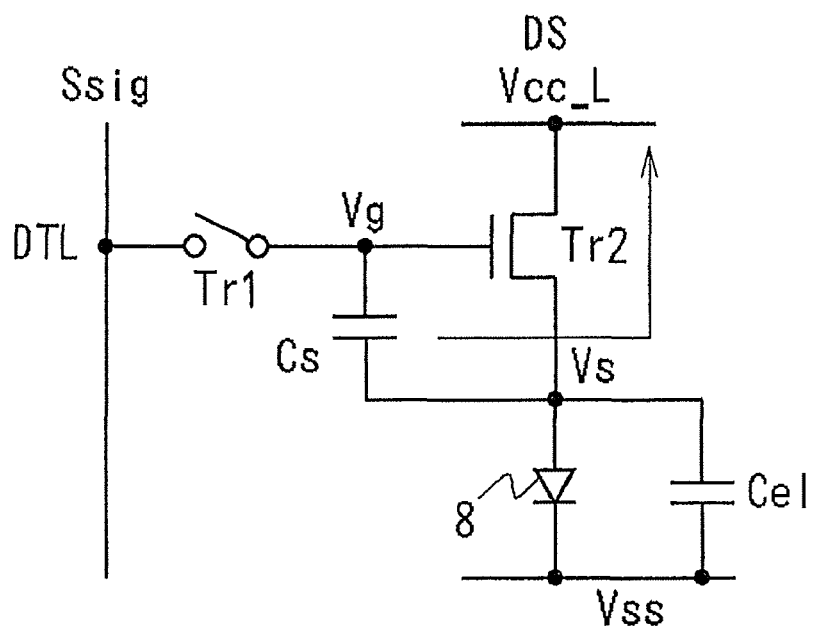
FIG. 7 is a connection diagram for explanation following FIG. 6.

Thereby, as illustrated in FIG. 7, accumulated electric charge on the organic EL device 8-side end of the retentive capacity Cs is flown to the scanning line DSL through the drive transistor Tr2. In the result, a source voltage Vs of the drive transistor Tr2 is fallen down to the voltage VccL (FIG. 5(E)), and light emission of the organic EL device 8 is stopped. Further, in association with fall of the source voltage Vs, a gate voltage Vg of the drive transistor Tr2 is lowered (FIG. 5(D)).

Figure 8:
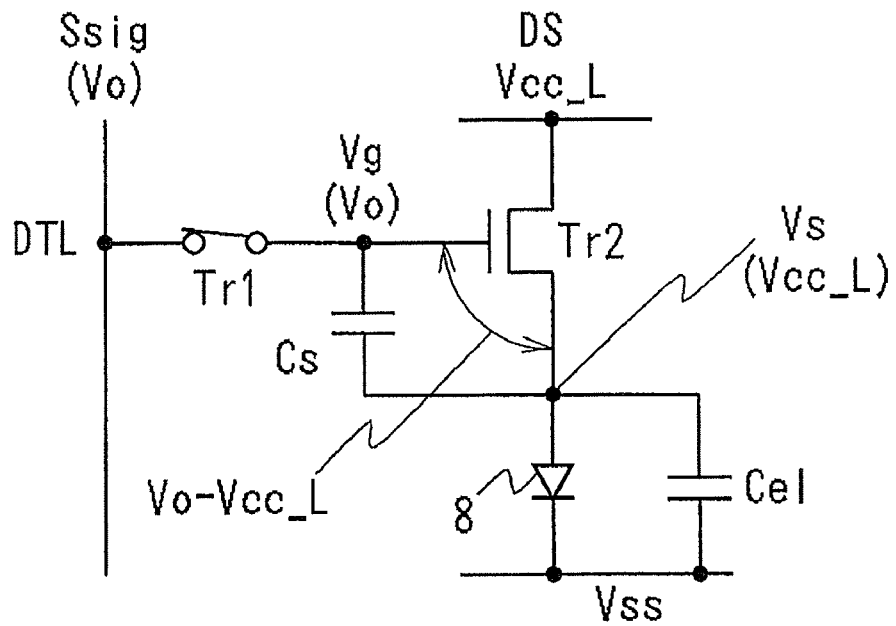
FIG. 8 is a connection diagram for explanation following FIG. 7.

In subsequent given timing t1, the writing transistor Tr1 is switched to on state by the writing signal WS (FIG. 5(A)), and the gate voltage Vg of the drive transistor Tr2 is set to the fixed voltage Vo for correcting the threshold voltage set for the signal line DTL (FIGS. 5(C) and 5(D)). Thereby, as illustrated in FIG. 8, the gate-to-source voltage Vgs of the drive transistor Tr2 is set to a voltage Vo-VccL. By setting the voltages Vo and VccL, the voltage Vo-VccL is set to a voltage larger than a threshold voltage Vth of the drive transistor Tr2.

After that, in timing t2, the drain voltage of the drive transistor Tr2 is risen up to the electric power source voltage VccH by the drive signal DS (FIG. 5(B)). Thereby, a charge current Ids is flown to the organic EL device 8-side end of the retentive capacity Cs through the drive transistor Tr2. In the result, the voltage Vs on the organic EL device 8 side of the retentive capacity Cs is gradually increased. In this case, the charge current Ids is used only for charging the capacity Cel of the organic EL device 8 and the retentive capacity Cs. In the result, only the source voltage Vs of the drive transistor Tr2 is simply increased without making the organic EL device 8 emit light.

Figure 9:
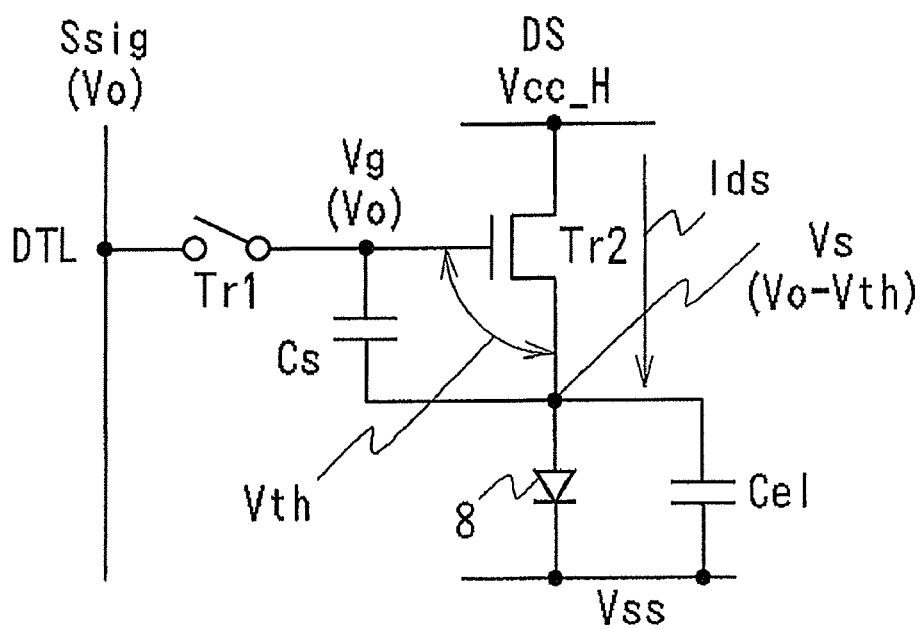
FIG. 9 is a connection diagram for explanation following FIG. 8.

In the case where the interterminal voltage of the retentive capacity Cs becomes the threshold voltage Vth of the drive transistor Tr2, flowing of the charge current Ids through the drive transistor Tr2 is stopped, and increase of the source voltage Vs of the drive transistor Tr2 is stopped. Thereby, the interterminal voltage of the retentive capacity Cs is discharged through the drive transistor Tr2. As illustrated in FIG. 9, the interterminal voltage of the retentive capacity Cs is set to the threshold voltage Vth of the drive transistor Tr2.

Figure 10:
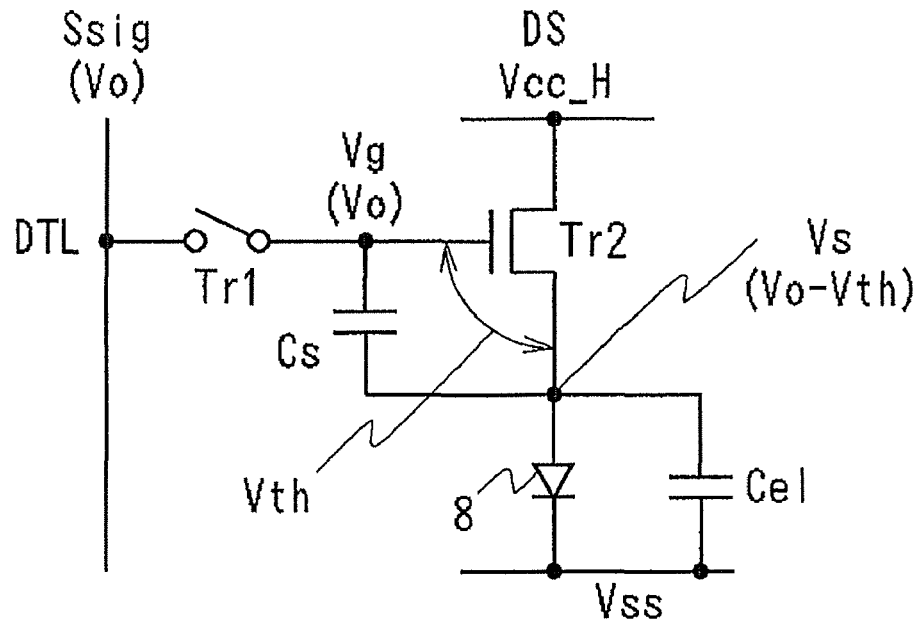
FIG. 10 is a connection diagram for explanation following FIG. 9.
Figure 11:
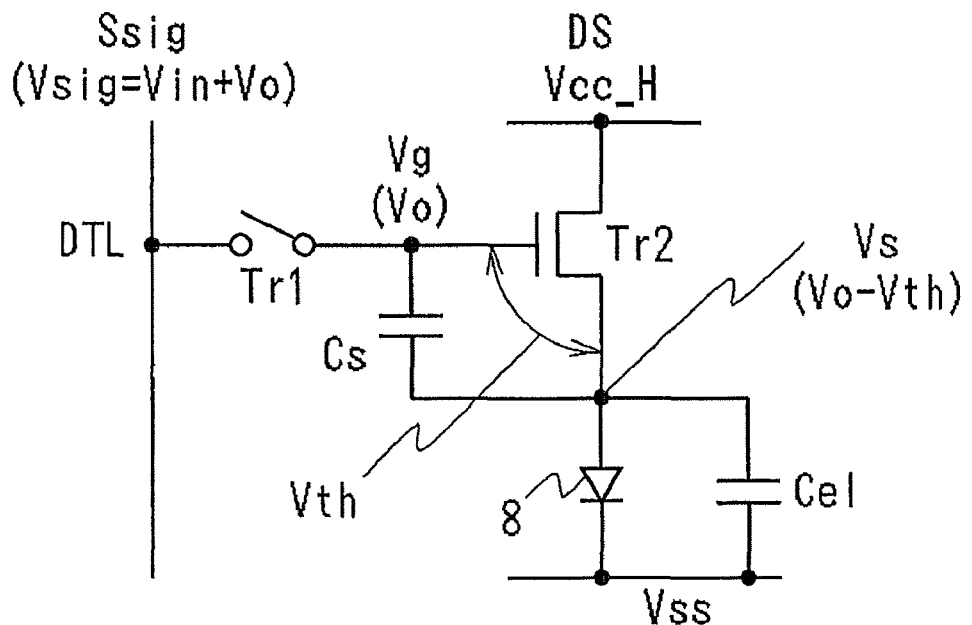
FIG. 11 is a connection diagram for explanation following FIG. 10.

In timing t3 after time sufficient for setting the interterminal voltage of the retentive capacity Cs to the threshold voltage Vth of the drive transistor Tr2 elapses, as illustrated in FIG. 10, the writing transistor Tr1 is switched to off state by the writing signal WS (FIG. 5(A)). Subsequently, as illustrated in FIG. 11, a voltage of the signal line DTL is set to a tone setting voltage Vsig (=Vin+Vo).

Figure 12:
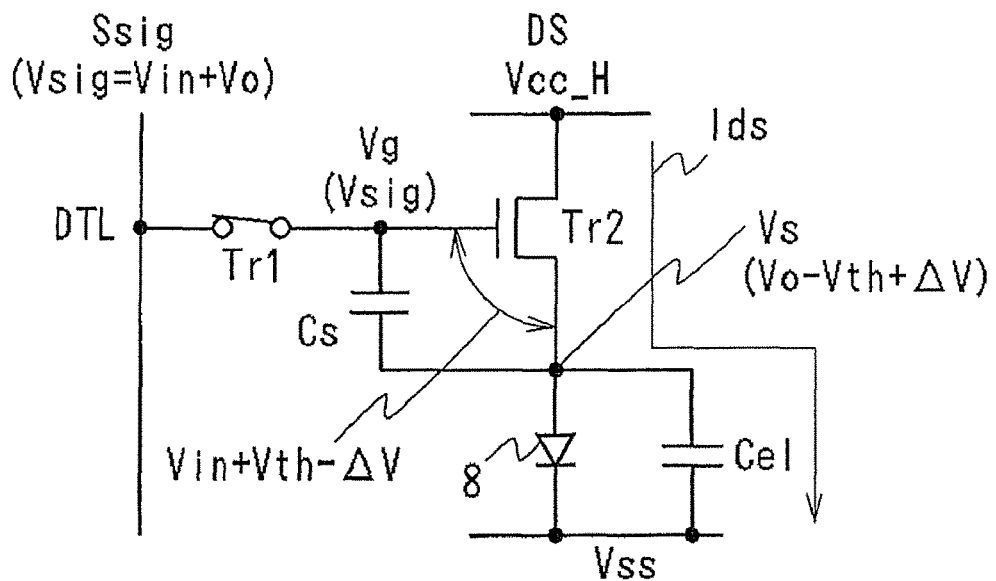
FIG. 12 is a connection diagram for explanation following FIG. 11.

In subsequent given timing t4, the writing transistor Tr1 is set to on state (FIG. 5(A)). Thereby, as illustrated in FIG. 12, the gate voltage Vg of the drive transistor Tr2 is set to the tone setting voltage Vsig, and the gate-to-source voltage Vgs of the drive transistor Tr2 is set to a voltage obtained by adding the threshold voltage Vth of the drive transistor Tr2 to the tone voltage Vin. Thereby, in the pixel circuit 5, the organic EL device 8 is able to be driven while effectively avoiding variation of the threshold voltage Vth of the drive transistor Tr2, and image quality deterioration due to luminance variation of the organic EL device 8 is able to be prevented.

In the pixel circuit 5, in setting the gate voltage Vg of the drive transistor Tr2 to the tone setting voltage Vsig, the gate of the drive transistor Tr2 is connected to the signal line DTL for a certain period in a state that the drain voltage of the drive transistor Tr2 is retained at the electric power source voltage VccH. Thereby, variation of mobility μ of the drive transistor Tr2 is corrected.

That is, in the case where the writing transistor Tr1 is set to on state and the gate of the drive transistor Tr2 is connected to the signal line DTL in a state that the interterminal voltage of the retentive capacity Cs is set to the threshold voltage Vth of the drive transistor Tr2, the gate voltage Vg of the drive transistor Tr2 is gradually increased from the fixed voltage Vo, and is set to the tone setting voltage Vsig.

Here, in the pixel circuit 5, writing-time constant necessary for rising up the gate voltage Vg of the drive transistor Tr2 is set lower compared to time constant necessary for rising up the source voltage Vs by the drive transistor Tr2.

In this case, after the writing transistor Tr1 executes on action, the gate voltage Vg of the drive transistor Tr2 immediately rises up to the tone setting voltage Vsig (=Vo+ Vin). At the time of such rise-up of the gate voltage Vg, if the capacity Cel of the organic EL device 8 is sufficiently larger than the retentive capacity Cs, the source voltage Vs of the drive transistor Tr2 is not changed.

However, in the case where the gate-to-source voltage Vgs of the drive transistor Tr2 is increased more than the threshold voltage Vth, the current Ids is flown from the electric power source VccH through the drive transistor Tr2, and the source voltage Vs of the drive transistor Tr2 is gradually increased. In the result, the interterminal voltage of the retentive capacity Cs is discharged from the drive transistor Tr2, and increase rate of the gate-to-source voltage Vgs is lowered.

Such discharge rate of the interterminal voltage varies according to capability of the drive transistor Tr2. More specifically, as the mobility μ of the drive transistor Tr2 is larger, the discharge rate is more increased.

As a result, in the pixel circuit 5, setting is made so that as the mobility μ of the drive transistor Tr2 is larger, the interterminal voltage of the retentive capacity Cs is lower and thus luminance variation due to mobility variation is corrected. In addition, the lowering portion of the interterminal voltage according to correction of the mobility μ is indicated by AV in FIG. 5, FIG. 12, and FIG. 13.

Figure 13:
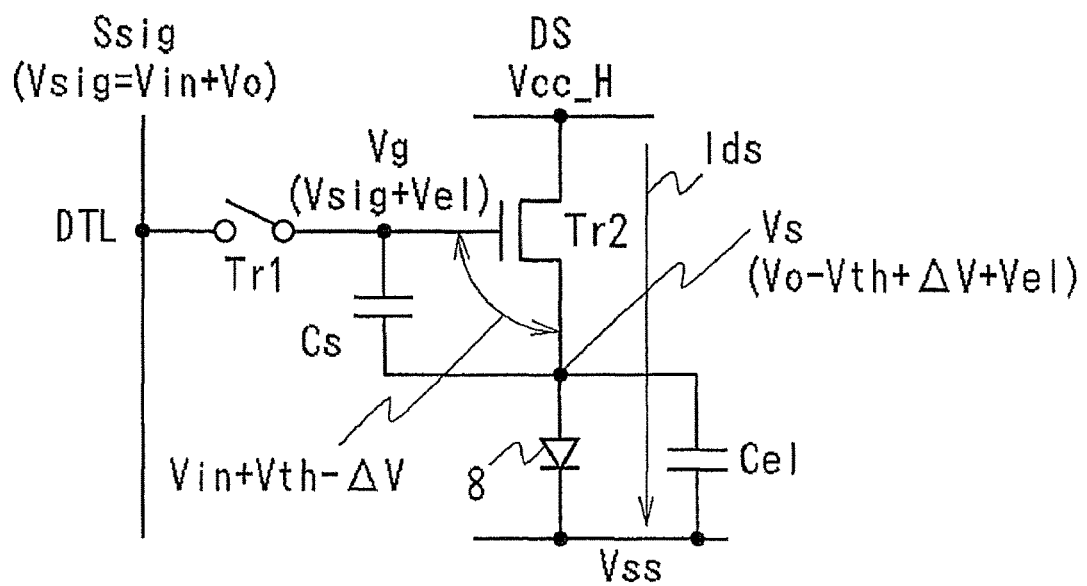
FIG. 13 is a connection diagram for explanation following FIG. 12.

In the pixel circuit 5, when the correction period of the mobility elapses, the writing signal WS is fallen in timing t5. In the result, light emitting period is started, and as illustrated in FIG. 13, the organic EL device 8 emits light by the drive current Ids according to the interterminal voltage of the retentive capacity Cs. When the light emitting period is started, the gate voltage Vg and the source voltage Vs of the drive transistor Tr2 are increased by a so-called boot strap circuit. Vel in FIG. 13 represents an increase portion voltage.

Accordingly, in the pixel circuit 5, during the period when the gate voltage of the drive transistor Tr2 is fallen to the voltage VccL from the timing t0 to the timing t1, process for correcting the threshold voltage of the drive transistor Tr2 is prepared. Moreover, during the subsequent period from the timing t2 to the timing t3, the interterminal voltage of the retentive capacity Cs is set to the threshold voltage Vth of the drive transistor Tr2, and the threshold voltage of the drive transistor Tr2 is corrected. Furthermore, during the period from the timing t4 to the timing t5, the mobility of the drive transistor Tr2 is corrected, and the tone setting voltage Vsig is sampled.

Figure 1:
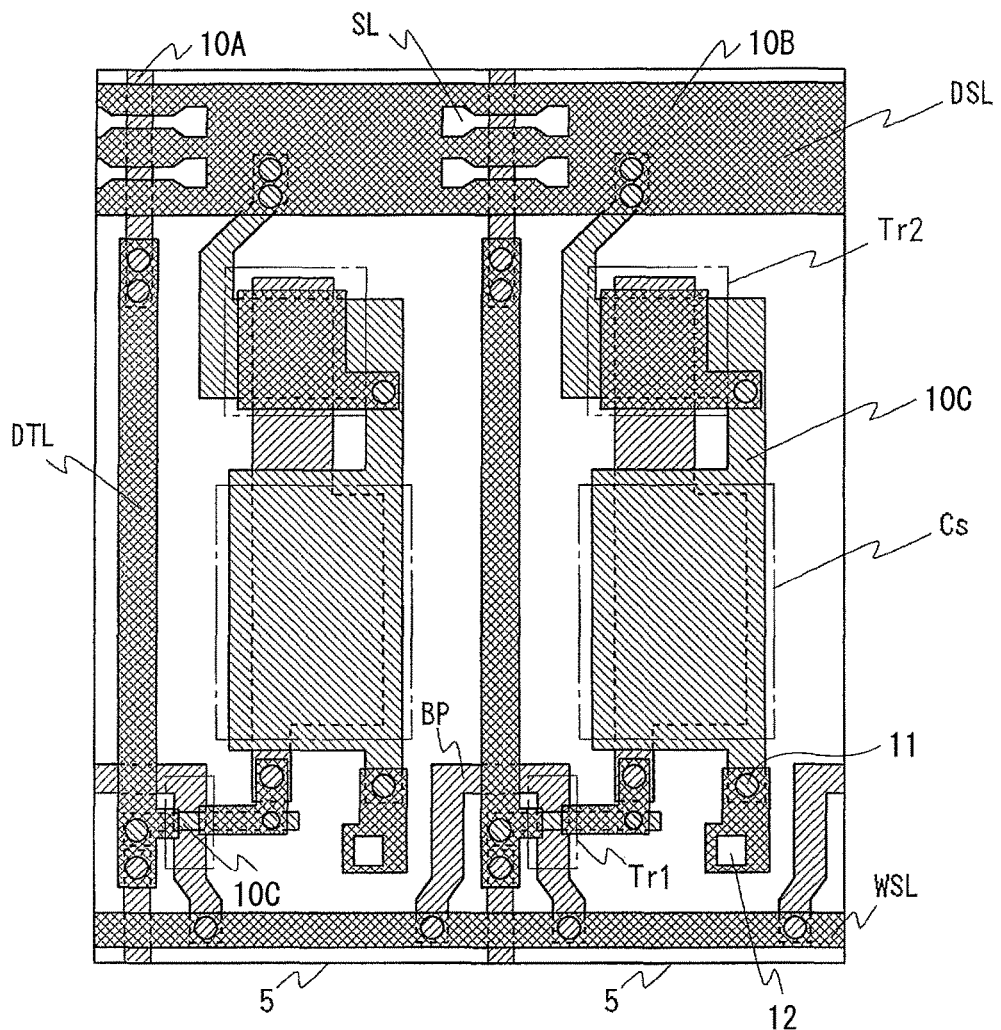
FIG. 1 is a plan view illustrating layout of a pixel circuit applied to an image display device according to a first embodiment of the present invention.

(1-2) Layout of Pixel Circuit (FIG. 1)

FIG. 1 illustrates layout of the wiring pattern in the pixel circuit 5. In the image display device 1, the display section 2 is formed by repeatedly arranging the pixel circuit 5 according to the layout illustrated in FIG. 1. It is to be noted that FIG. 1 illustrates a state that the substrate side is viewed by removing an upper layer member from the anode electrode of the organic EL device 8. In the figure, each wiring pattern of each layer is illustrated by each different hatching. Further, a circle indicates an interlayer contact 11, and a rectangle indicates an anode-use contact 12. Furthermore, inside of the circle (contact 11) is provided with hatching allocated to a wiring pattern of the connection destination, which shows interlayer connection relation.

In the pixel circuit 5, a first wiring 10A is formed by forming a wiring pattern material layer on an insulating substrate made of, for example, glass and subsequently providing the wiring pattern material layer with etching process. Subsequently, after a gate oxidized film is formed, an intermediate wiring 10C made of a polysilicon film is formed.

The first wiring 10A and the intermediate wiring 10C are formed to be locally opposed to each other in the approximately central region, and the retentive capacity Cs is formed from such an opposed region. Subsequently, after a channel protective layer and the like are formed, the writing transistor Tr1 and the drive transistor Tr2 are formed by impurity doping.

Subsequently, after the wiring pattern material layer is formed, the wiring pattern material layer is provided with etching process, and thereby a second wiring 10B is formed.

Next, defect detection process described later is executed, and the defect location is repaired. Subsequently, after a planarized film having a given film thickness is formed, the anode electrode of the organic EL device 8 is formed. After that, a material film of the organic EL device 8, a cathode electrode, and a protective film are sequentially layered. After that, a sealing transparent substrate is arranged.

In this embodiment, in the pixel circuit 5, the signal line DTL extending in the vertical direction is formed on the left end side of the pixel circuit 5. Further, the scanning line DSL for the electric power source and the scanning line WSL for the writing signal extending in the horizontal direction are formed respectively above and below the pixel circuit 5.

This kind of the image display device 1 has a characteristic that the resistance value of the second wiring 10B is significantly smaller than that of the first wiring 10A. Specifically, the sheet resistance value of the first wiring 10A is about 50 times that of the second wiring 10B. Further, in the image display device 1, impedance of the signal line DTL and the scanning lines DSL and WSL should be small.

Therefore, in this embodiment, the scanning line DSL for the electric power source and the scanning line WSL for the writing signal are formed from the second wiring 10B. Further, the width of the scanning line DSL for the electric power source is formed wider than that of the scanning line WSL for the writing signal. In addition, the signal line DTL is formed from the second wiring 10B as much as possible. Specifically, the signal line DTL is formed from the first wiring 10A only in the region where the signal line DTL intersects with the scanning lines DSL and WSL, and the rest of the signal line DTL is formed from the second wiring 10B. Further, in the result, the signal line DTL is respectively provided with a contact that connects the first wiring 10A with the second wiring 10B so that the region where the signal line DTL intersects with the scanning lines DSL and WSL is sandwiched between the contacts.

The scanning line DSL for the electric power source in the region where the signal line DTL intersects with the scanning line DSL for the electric power source is provided with a slit SL in the shape of cutting the signal line DTL that passes over the signal line DTL. In two locations at which the scanning line DSL for the electric power source is approximately trisected in the width direction, the foregoing slits SL are provided along with the extension direction of the signal line DTL. To execute favorable trimming with the use of laser beam, both ends of the slits SL are projected from both side end sections of the signal line DTL, and an opening is formed in the foregoing both ends.

In the scanning line WSL on the scanning drive circuit 4 side and on the opposite side of the scanning drive circuit 4 side that is located apart from the region where the signal line DTL intersects with the scanning line WSL for the writing signal by distance sufficient for laser trimming, a first contact and a second contact for securing connection with the first wiring 10A are respectively provided. A wiring pattern BP for bypassing the region where the signal line DTL intersects with the scanning line WSL for the writing signal is formed from a wiring pattern of the first wiring 10A starting from the first contact and the second contact. Specifically, the wiring pattern BP is formed from the first wiring 10A to pass over the signal line DTL and to connect the first contact with the second contact in a region which is different from the region where the signal line DTL intersects with the scanning line WSL for the writing signal and in which the signal line DTL is formed from the second wiring line 10B. Further, the wiring pattern BP is connected to the gate of the drive transistor Tr2, and is allocated to a transmission path of the writing signal WS. In this embodiment, the wiring pattern of the first wiring 10A is formed to contact the gate of the writing transistor Tr1 with the corresponding first and second contacts respectively with the writing transistor Tr1 in between.

(1-3) Repair Process (FIG. 14 to FIG. 21)

In this embodiment, in the manufacturing step of the image display device 1, a short circuit location between wiring patterns is detected by defect detection process, and the detected short circuit location is repaired in subsequent repair process. In the manufacturing step, repair process is executed according to the detected short circuit failure region.

That is, in the case where a short circuit failure is detected in a location on which no other wiring pattern is layered, the short circuit region is trimmed by irradiating the short circuit region with laser beam, and thereby the short circuit location is repaired. Specifically, for example, as indicated by referential symbol A in FIG. 14, in the case where the scanning line WSL for the writing signal and the scanning line DSL for the electric power source are shorted in a region other than the region where the scanning line WSL for the writing signal and the scanning line DSL for the electric power source intersect with the signal line DTL, the portion between the scanning lines WSL and DSL is trimmed by irradiation with laser beam, and thereby the short circuit location is repaired.

Figure 14:
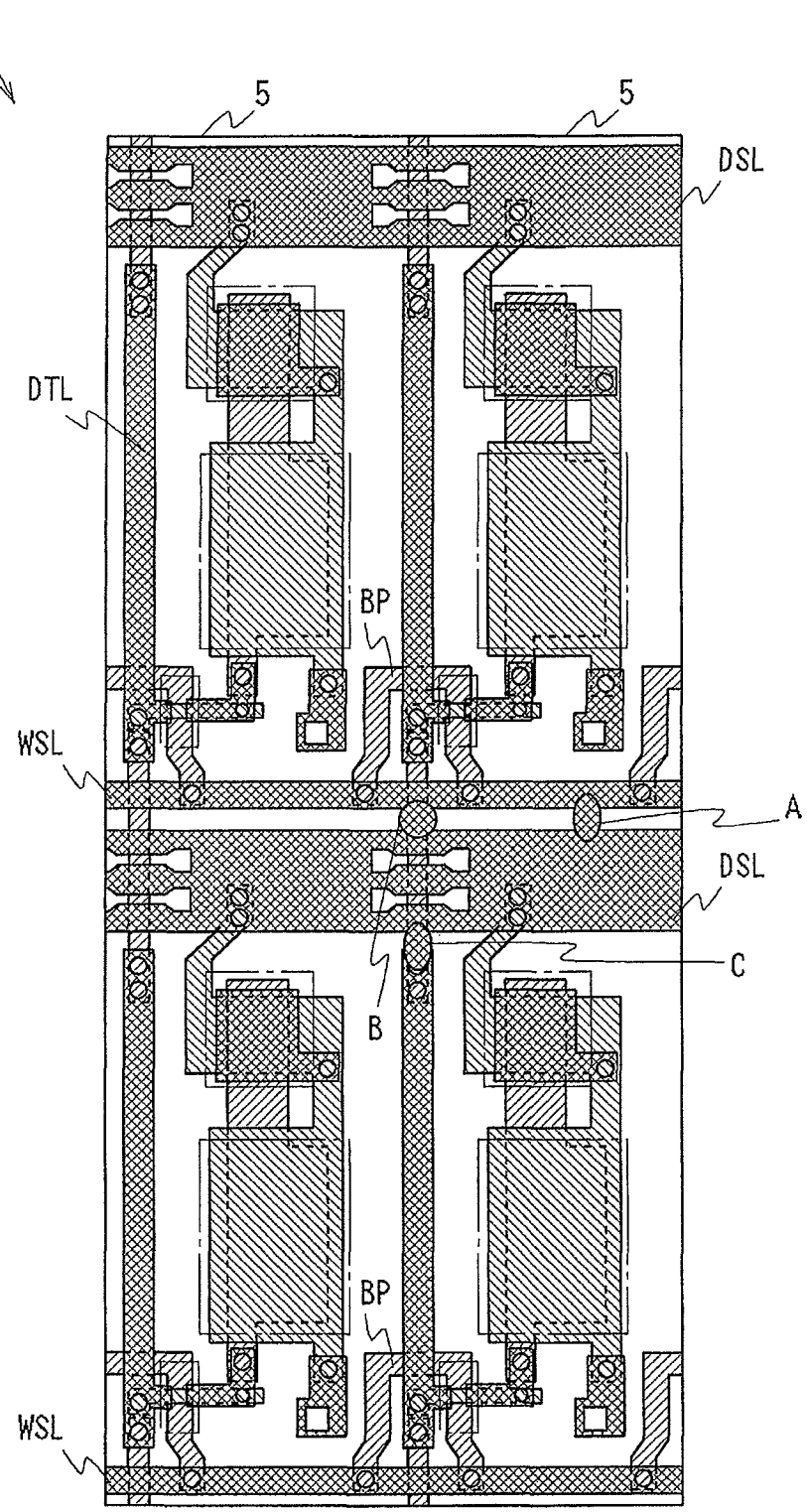
FIG. 14 is a plan view illustrating a short circuit location.
Figure 15:
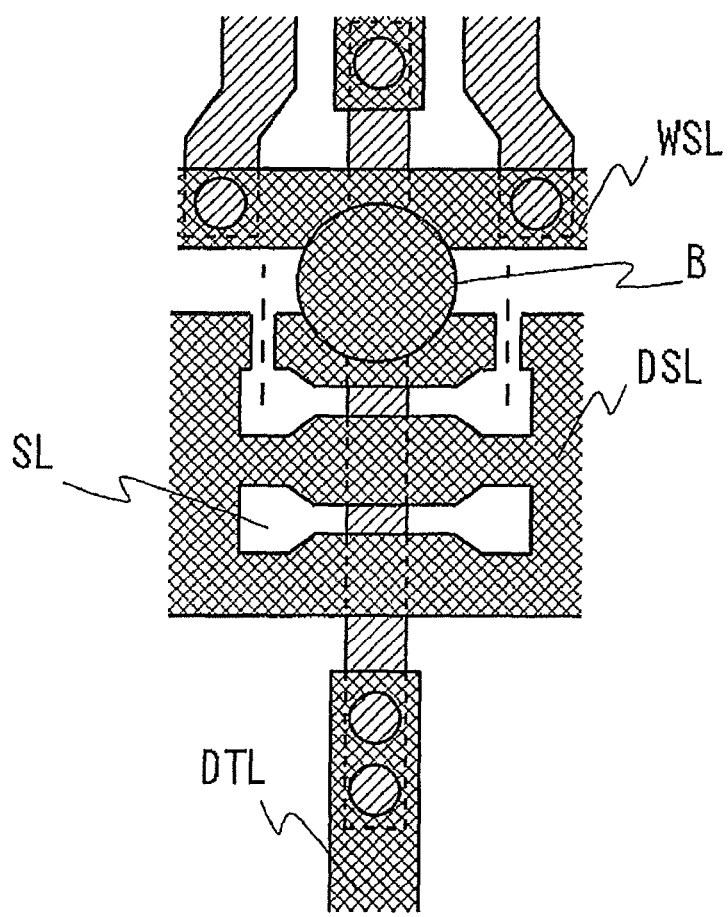
FIG. 15 is a plan view for explaining repair process by using a slit.

Meanwhile, as indicated by referential symbol B in FIG. 14, in the case where the scanning line WSL for the writing signal and the scanning line DSL for the electric power source are shorted in a region on the opposite side of the bypass wiring pattern BP in the region where the scanning line WSL for the writing signal and the scanning line DSL for the electric power source intersect with the signal line DTL, as illustrated in FIG. 15, with the use of the slit SL, the region where the signal line DTL and the scanning line WSL are shorted is separated from the scanning line DSL for the electric power source, and thereby the short circuit location is repaired. That is, in the slit SL on the side where the short circuit failure occurs, the wiring pattern of the scanning line DSL is cut by laser trimming from the openings on both ends to the side where the short circuit failure occurs, respectively, and thereby the short circuit location is repaired. In FIG. 15 and the after-mentioned figures, each central line of laser trimming is indicated by a dashed line as appropriate.

Figure 16:
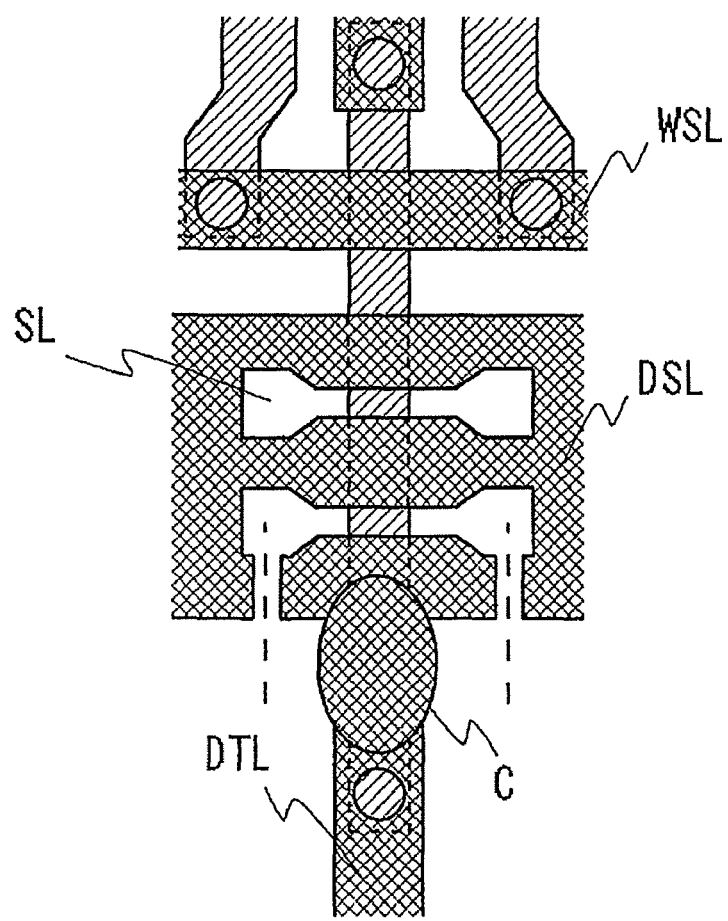
FIG. 16 is a plan view for explaining repair process by using a slit with the use of an example different from FIG. 15.

Further, as indicated by referential symbol C in FIG. 14, in the case where the signal line DTL and the scanning line DSL for the electric power source are shorted in a region in the region where the signal line DTL and the scanning line DSL for the electric power source intersect with each other, as illustrated in FIG. 16, the short circuit location is repaired by laser trimming with the use of the slit SL in the same manner as that described for FIG. 15.

Figure 17:
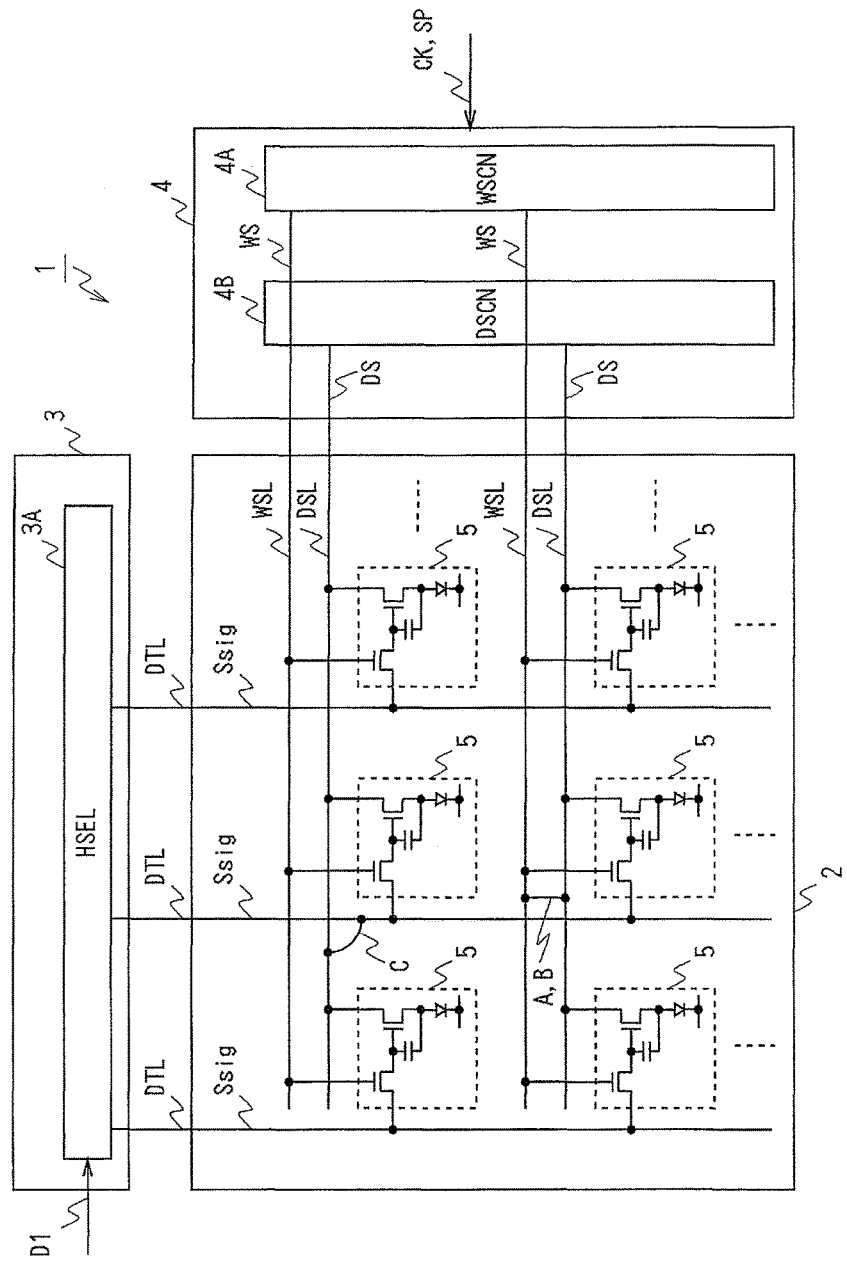
FIG. 17 is a connection diagram illustrating a short circuit location in an equivalent manner

The connecting diagram of FIG. 17 illustrates the short circuit failures indicated by the foregoing referential symbols A to C in an equivalent manner. In the case where the short circuit location between the scanning line WSL for the writing signal and the scanning line DSL for the electric power source as indicated by the referential symbols A and B exists, it is difficult to normally display an image in each line related to the scanning lines DSL and WSL, and horizontal line defect is observed. Further, in the case where the short circuit location between the scanning line DSL and the scanning line DSL for the electric power source as indicated by the referential symbol C exists, a defect as a bright line or a black line in the vertical direction is observed.

Figure 18:
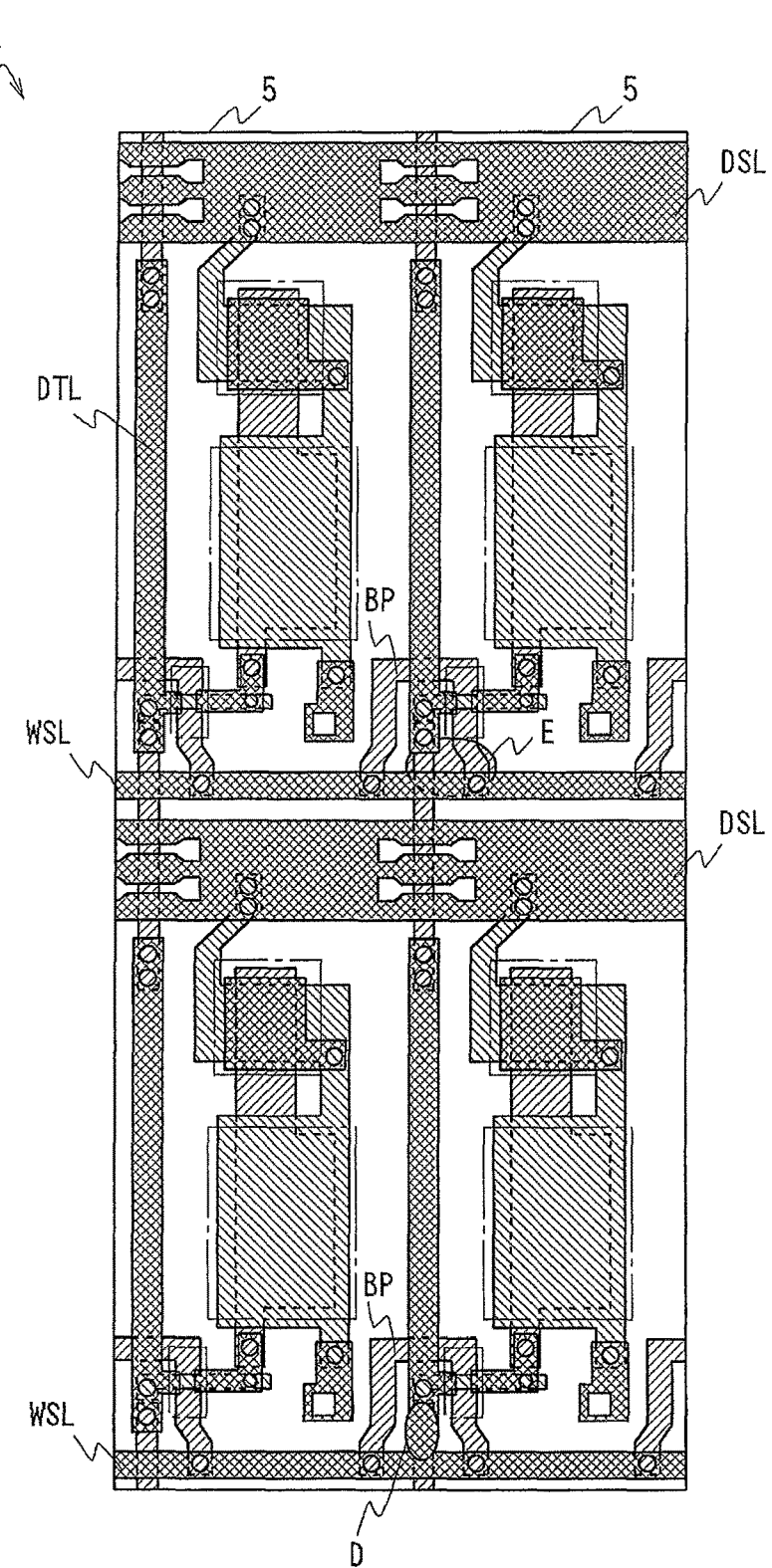
FIG. 18 is a plan view for explaining a short circuit location between a signal line and a scanning line for a writing signal.
Figure 19:
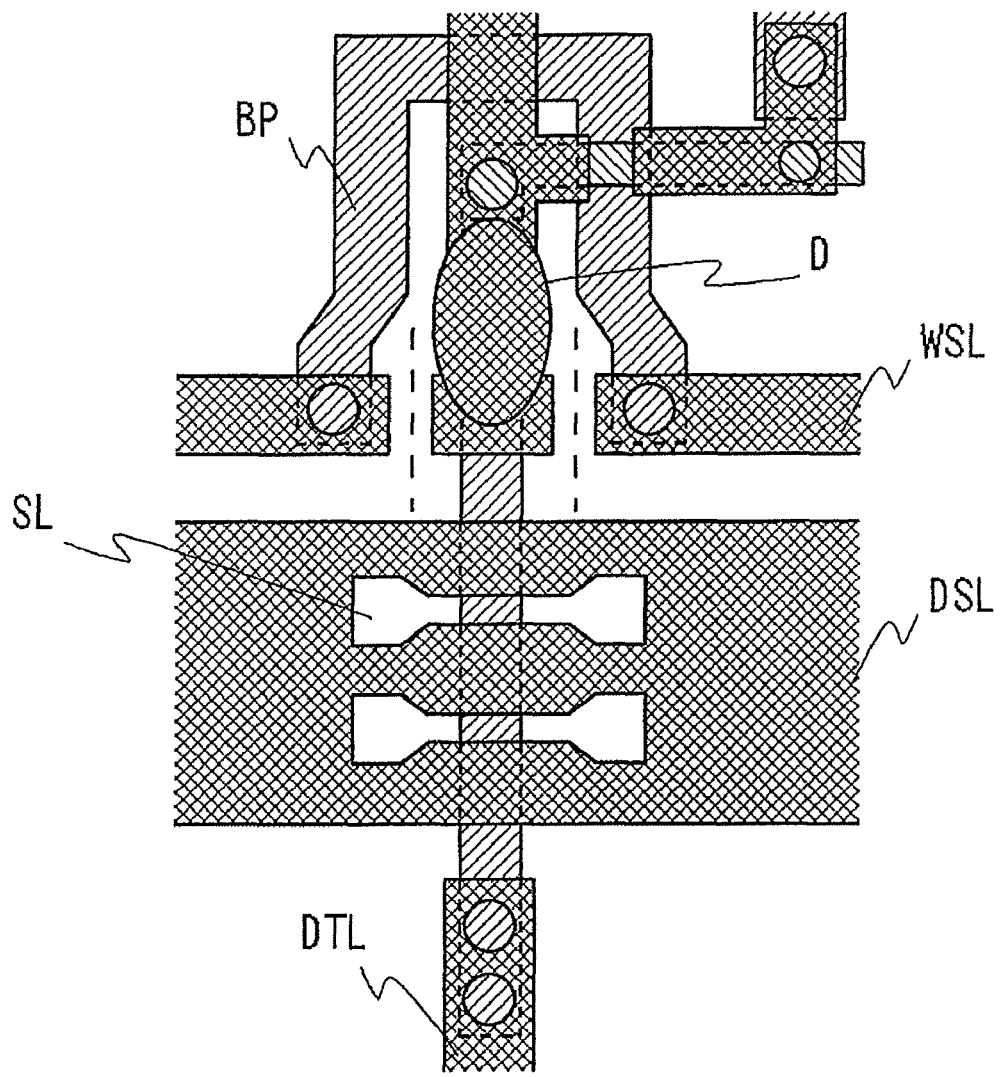
FIG. 19 is a plan view for explaining repair of the short circuit location of FIG. 18.

Meanwhile, as indicated by referential symbol D in FIG. 18, in the case where the signal line DTL and the scanning line WSL for the writing signal are shorted on the bypass wiring pattern BP side due to a defect of the second wiring 10B, as illustrated in FIG. 19, the wiring pattern of the scanning line WSL is cut by laser trimming in a region that is located on both sides of the location where the short circuit failure occurs and that is inside of the first and the second contacts, and thereby the short circuit location is repaired.

Figure 20:
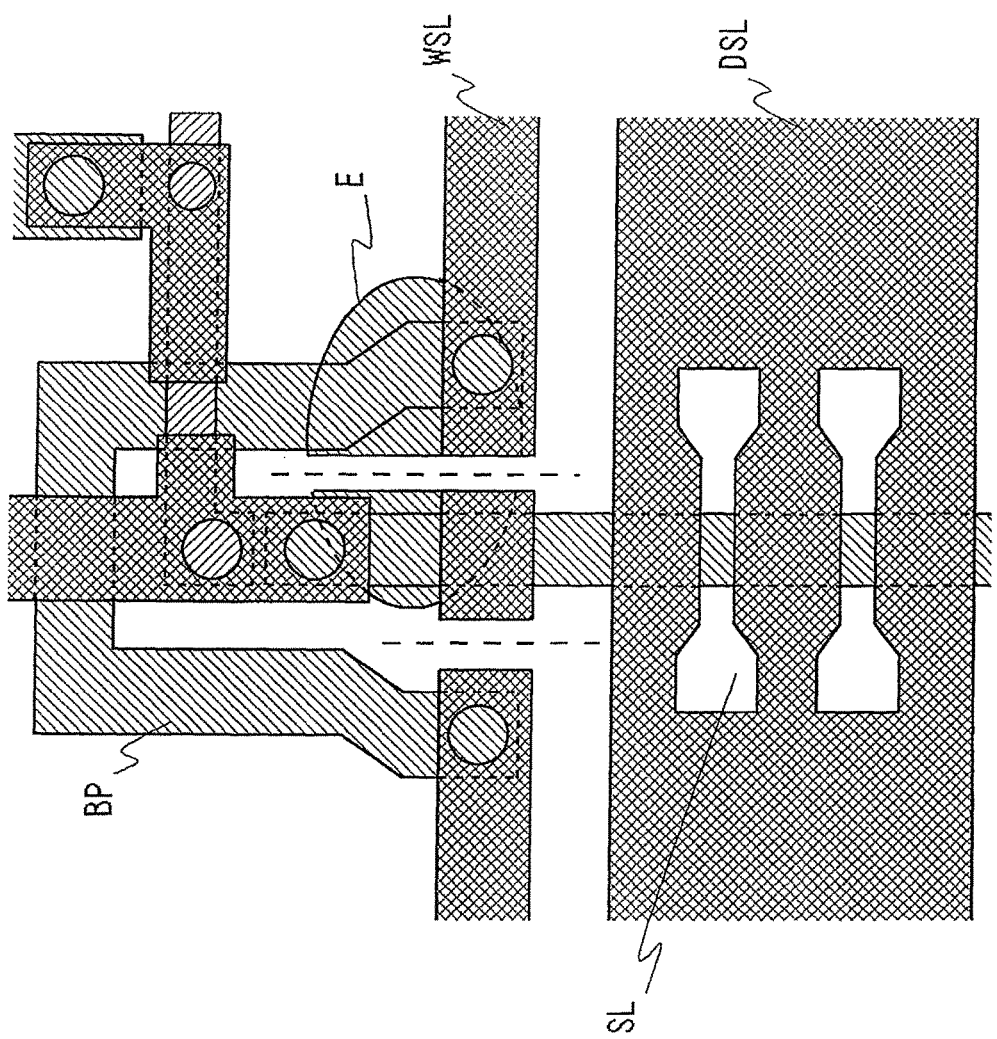
FIG. 20 is a plan view for explaining repair of a short circuit location with the use of an example different from FIG. 19.

Further, as indicated by referential symbol E in FIG. 18, in the case where the signal line DTL and the scanning line WSL for the writing signal are shorted due to a defect of the first wiring 10A, as illustrated in FIG. 20 in contrast with FIG. 19, the wiring pattern of the scanning line WSL is cut by laser trimming in a region that is located on both sides of the location where the short circuit failure occurs and that is inside of the first and the second contacts together with the short circuit region, and thereby the short circuit location is repaired.

Figure 21:
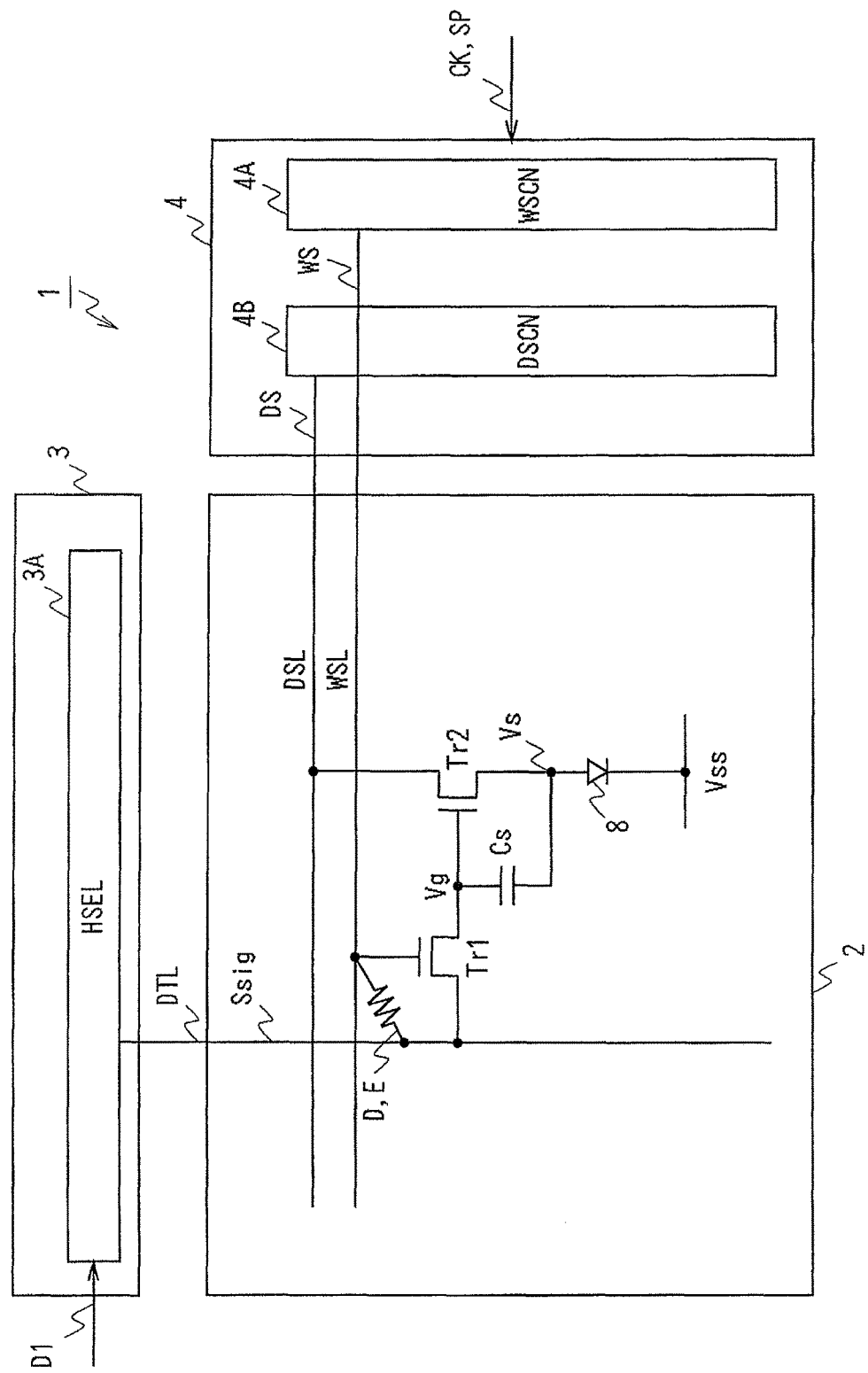
FIG. 21 is a connection diagram illustrating a short circuit failure in an equivalent manner

The connecting diagram illustrated in FIG. 21 illustrates the short circuit failures indicated by the foregoing referential symbols D and E in an equivalent manner. In this case, in the pixel circuit 5 where the short circuit failure occurs, the scanning line WSL and the signal line DSL are connected on a steady basis under given impedance, and a relevant pixel is observed as a defect.

(2) Operation of this Embodiment (FIG. 1 to FIG. 22)

In the image display device 1 of this embodiment, in the signal line drive circuit 3, the sequentially inputted image data D1 is sorted into each signal line DTL of the display section 2 (FIG. 2 and FIG. 3), and is subsequently provided with digital analog conversion process. Thereby, the tone voltage Vin that indicates tone of each pixel connected to the signal line DTL is formed for every signal line DTL. Further, by driving the display section by the scanning line drive circuit 4, in the respective pixel circuits 5 composing the display section 2, the tone voltage Vin is set by, for example, line sequence. By driving by the drive transistor Tr2 according to the tone voltage Vin, the organic EL device 8 respectively emits light (FIG. 4). Thereby, in the image display device 1, an image according to the image data D1 is able to be displayed in the display section 2.

More specifically, in the pixel circuit 5, the organic EL device 8 is current-driven by the drive transistor Tr2 having the source follower circuit configuration. Further, the voltage on the gate side end of the retentive capacity Cs provided between the gate and the source of the drive transistor Tr2 is set to the voltage Vsig according to the tone voltage Vin. Thereby, the organic EL device 8 emits light at luminance according to the image data D1, and a desired image is displayed.

However, the drive transistor Tr2 applied to the pixel circuit 5 has a disadvantage that variation of the threshold voltage Vth is large. Thus, if the voltage on the gate side end of the retentive capacity Cs is simply set to the voltage Vsig according to the tone voltage Vin, luminance of the organic EL device 8 varies according to variation of the threshold voltage Vth of the drive transistor Tr2, and the image quality is deteriorated.

Thus, in the image display device 1 of this embodiment, for example, due to previous control of the drive transistor Tr2 by the drive signal DS and the writing signal WS, the interterminal voltage of the retentive capacity Cs is set to the threshold voltage Vth of the drive transistor Tr2 (FIG. 4 to FIG. 7). After that, in the image display device 1, the terminal voltage of the retentive capacity Cs is set to the tone setting voltage Vsig (Vin+Vo) (FIG. 11). Thereby, image quality deterioration due to variation of the threshold voltage Vth of the drive transistor Tr2 is able to be prevented. Further, by retaining the gate voltage of the drive transistor Tr2 at the tone setting voltage Vsig in a state that an electric power source is supplied to the drive transistor Tr2 for certain period, image quality deterioration due to mobility variation of the drive transistor Tr2 is able to be prevented.

Accordingly, in the image display device 1, for example, in setting tone of the respective pixel circuits 5 by line sequence, the writing transistor Tr1 should be on/off controlled precisely by the writing signal WS. Further, since the drive current of the organic EL device 8 is supplied through the scanning line DSL for the electric power source, voltage drop in the scanning line DSL should be sufficiently small. Accordingly, in the image display device 1, impedance of the scanning lines DSL and WSL should be sufficiently small. Further, impedance of the signal line DTL should be sufficiently small.

In this embodiment, the pixel circuit 5 is formed from the laminated structure composed of the first wiring 10A, the intermediate wiring 10C, and the second wiring 10B with the interlayer insulating film or the like in between (FIG. 1). Further, since the second wiring 10B has the lowest resistance value among the first wiring 10A, the intermediate wiring 10C, and the second wiring 10B, the scanning line WSL for the writing signal WS and the scanning line DSL for the electric power source are formed from the second wiring 10B. Further, the width of the scanning line DSL for the electric power source is formed wider than that of the scanning line WSL for the writing signal WS. Thereby, impedance of the scanning line WSL and the scanning line DSL for the electric power source is able to be sufficiently decreased.

Further, the signal line DTL is formed from the first wiring 10A only in the region where the signal line DTL intersects with the scanning lines DSL and WSL, and the signal line DTL is formed from the second wiring 10B in the region where the signal line DTL does not intersect with the scanning lines DSL and WSL. Furthermore, the signal line DTL is provided with a contact that connects the first wiring 10A with the second wiring 10B with the region where the signal line DTL intersects with the scanning line WSL in between. Thereby, impedance of the signal line DTL is also able to be sufficiently decreased.

In the image display device 1, the pixel circuit 5 should be densely arranged for high resolution. In the result, short circuit failures easily occur between wiring patterns provided in the same layer for high resolution. That is, there is a possibility that a short circuit failure occurs between the scanning lines WSL and DSL (FIG. 14, referential symbols A and B), between the scanning line WSL and the second wiring 10B of the signal line DTL (FIG. 14, referential symbol C), and between the scanning line DSL and the second wiring 10B of the signal line DTL (FIG. 17, referential symbol D). Further, there is a possibility that a short circuit failure occurs between the first wiring 10A of the signal line DTL and the gate line of the writing transistor Tr1 (FIG. 17, referential symbol E) as well.

In particular, in the case where the signal line DTL is formed from the first wiring 10A and the second wiring 10B as in this embodiment, as the length of the first wiring 10A is shortened as much as possible, impedance of the signal line DTL is able to be lowered. Thus, in the case where the length of the first wiring 10A is shortened for the purpose of lowering the impedance of the signal line DTL, distance between the signal line DTL and the scanning line DSL/the scanning line WSL in the second wiring 10B is shortened, and short circuit failures easily occur.

Figure 22:
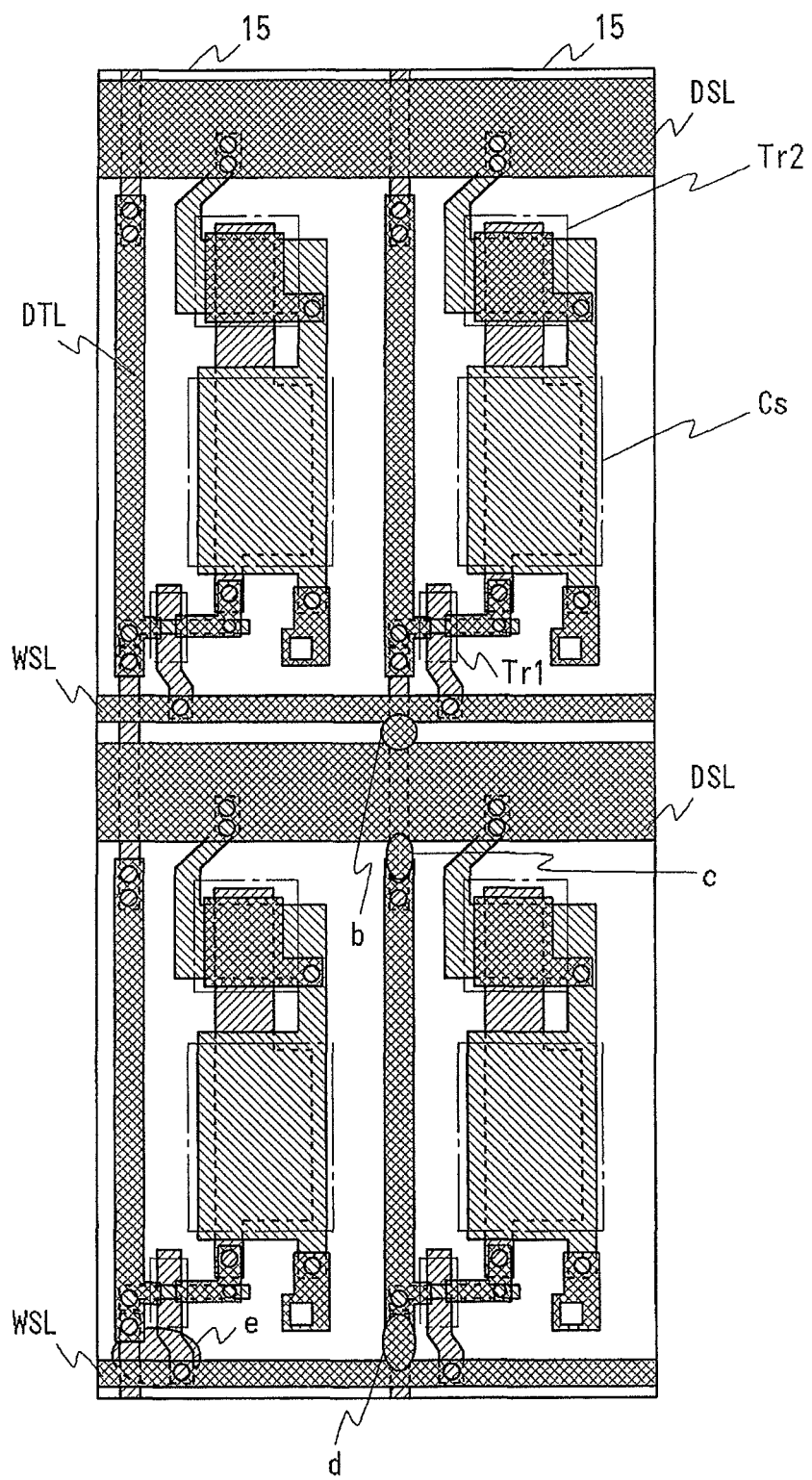
FIG. 22 is a plan view illustrating layout of a pixel circuit in the case that no ingenuity is exercised for short circuit failures.

In the image display device 1, short circuit locations are repaired by trimming with the use of laser beam. As indicated by referential symbol A in FIG. 14, the short circuit failure in a location where wiring patterns are not layered, the short circuit location is able to be repaired by simply cutting the short circuit location with the use of laser trimming However, for a region where wiring patterns are layered, other wiring pattern is also cut by laser trimming. In this case, it is difficult to repair the short circuit location. FIG. 22 illustrates a configuration of the pixel circuit 15 in the case that no ingenuity is exercised for repair process of short circuit locations. In the pixel circuit 15, the scanning line DSL for the electric power source is formed without providing the slit SL. Further, the gate line of the drive transistor Tr2 is provided to simply extend from the scanning line WSL for the writing signal.

In the case of FIG. 22, as indicated by referential symbols b to e corresponding to the referential symbols in FIG. 14 and FIG. 15, as for the short circuit location between the scanning lines WSL and DSL in the region where the scanning lines WSL and DSL intersect with the signal line DTL (referential symbol b), the short circuit location between the scanning line DSL and the second wiring 10B of the signal line DTL (referential symbol c), the short circuit location between the scanning line WSL and the second wiring 10B of the signal line DTL (referential symbol d), and the short circuit location between the first wiring 10A of the signal line DTL and the gate line of the writing transistor Tr1 (referential symbol e), it is difficult to repair the short circuit locations by laser trimming Meanwhile, in the image display device 1 of this embodiment, as for the scanning line DSL for the electric power source, the slit SL in the shape of passing over the signal line DTL is provided in the region where the scanning line DSL for the electric power source intersects with the signal line DTL (FIG. 1). By laser trimming with the use of the slit SL, a region where a short circuit failure occurs is separated from the scanning line DSL, and the short circuit location is repaired (FIG. 15 and FIG. 16). Thereby, in the case where the signal line DTL intersects with the scanning line DSL, even if a short circuit failure occurs in the region where the signal line DTL intersects with the scanning line DSL, it is possible to repair the short circuit location and to improve the yield.

However, the method of providing the slit is not applied to the short circuit location between the first wiring 10A of the signal line DTL and the gate line of the writing transistor Tr1 (FIG. 18, referential symbol E). Further, though the method of providing the slit is applicable to the short circuit location between the scanning line WSL and the second wiring 10B of the signal line DTL (FIG. 18, referential symbol D), the pattern width of the scanning line WSL should be wide. In the result, it is difficult to allocate sufficient pattern width to the scanning line DSL for the electric power source, and it becomes difficult to sufficiently lower the impedance of the scanning line DSL for the electric power source. In the case where the impedance of the scanning line DSL for the electric power source is not able to be sufficiently lowered, as the distance from the scanning line drive circuit 4 is larger, the drain voltage of the drive transistor Tr2 is lowered, and shading occurs. Further, in the case where the pattern width of the scanning line WSL for the writing signal is increased, crosstalk is increased, which possibly results in image quality deterioration.

In this embodiment, in the regions of the scanning line WSL on the scanning drive circuit 4 side and on the opposite side of the scanning drive circuit 4 side that are located apart from the region where the signal line DTL intersects with the scanning line WSL for the writing signal by distance enough for laser trimming, the first contact and the second contact are respectively provided. The bypass wiring pattern BP for connecting the first contact with the second contact is formed from the first wiring 10A.

Further, as for the short circuit location between the scanning line WSL and the second wiring 10B of the signal line DTL (FIG. 19) and the short circuit location between the first wiring 10A of the signal line DTL and the gate line of the writing transistor Tr1 (FIG. 20), the portion between the first contact and the region where the signal line DTL intersects with the scanning line WSL for the writing signal and the portion between the second contact and the region where the signal line DTL intersects with the scanning line WSL for the writing signal are cut by laser trimming so that the writing signal WS is transmitted through only the bypass wiring pattern BP. Thereby, in the image display device 1, in the case where the signal line DTL intersects with the scanning line WSL, even if a short circuit failure occurs in the region where the signal line DTL intersects with the scanning line WSL, it is possible to repair the short circuit location and to improve the yield.

Figure 23:
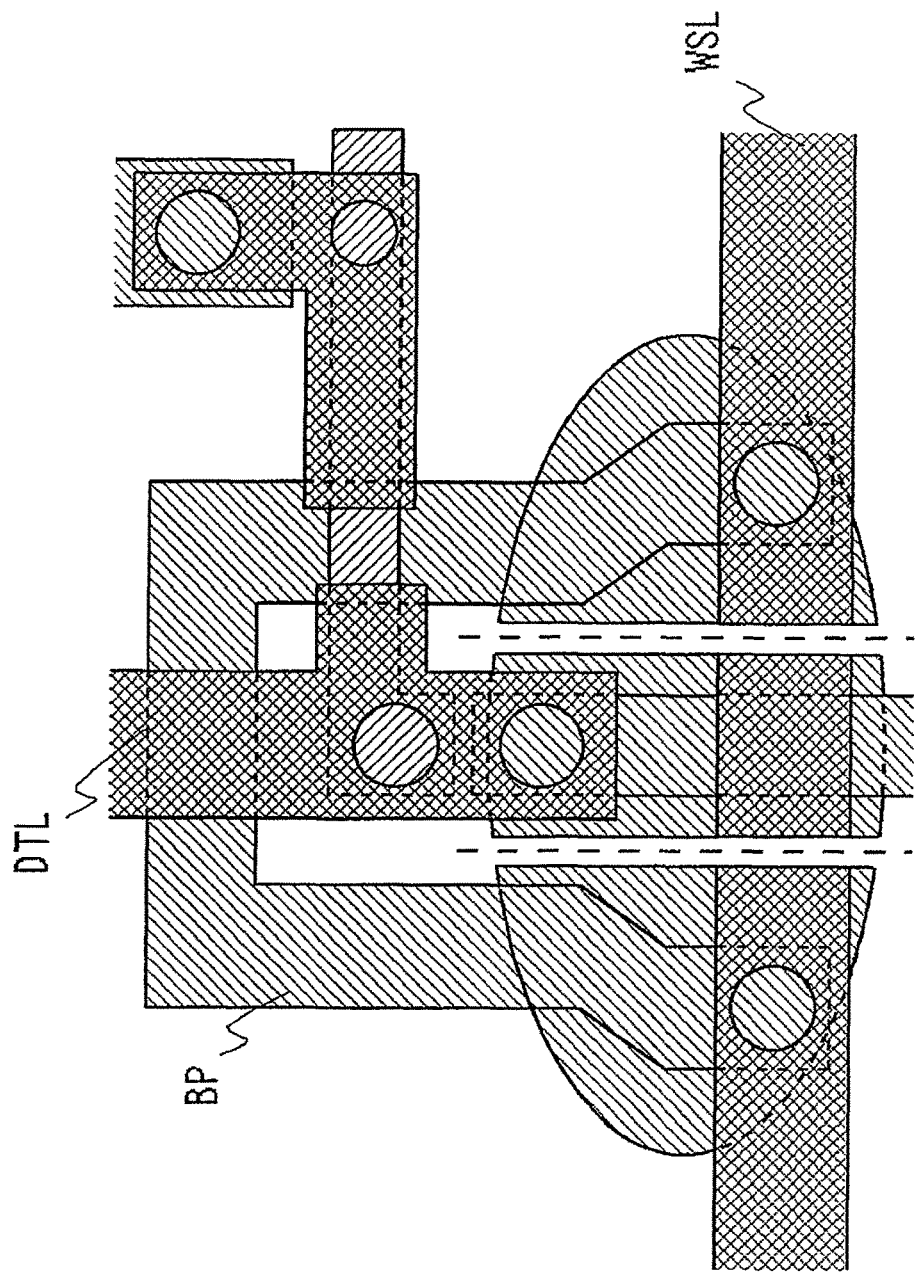
FIG. 23 is a plan view for explaining repair of a short circuit location with the use of an example different from FIG. 19 and FIG. 20.
Figure 24:
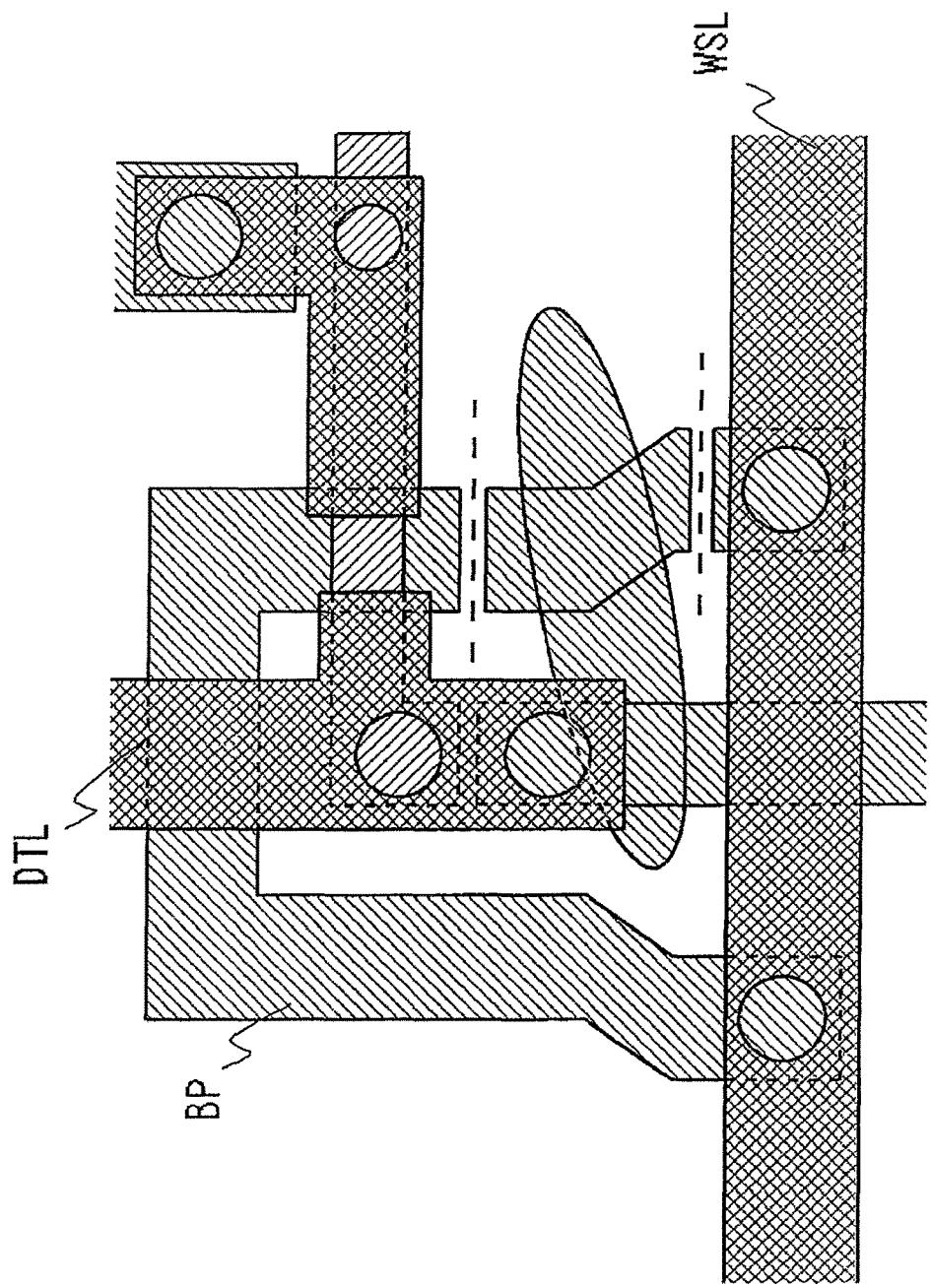
FIG. 24 is a plan view for explaining repair of a short circuit location with the use of an example different from FIG. 19, FIG. 20, and FIG. 23.

As illustrated in FIG. 23 in contrast with FIG. 19 and FIG. 20, according to this embodiment, even if a large scale short circuit failure in which the first and the second contacts are shorted including the first wiring 10A of the signal line DTL occurs, the short circuit location is able to be repaired. Further, as illustrated in FIG. 24, in the case where short circuit does not occur directly under the scanning line WSL, it is possible to repair the short circuit location by laser trimming of the bypass wiring pattern side.

Further, in this embodiment, since the bypass wiring pattern BP is set to function as the gate line of the writing transistor Tr1 as well, layout of the pixel circuit 5 is able to be simplified.

Further, the gate of the writing transistor Tr1 is connected with the scanning line WSL thorough the bypass wiring pattern connected with the scanning line WSL thorough the two contacts. Thus, even if one of the contacts loses conductivity due to a defect in contact formation step, the writing signal WS is able to be supplied to the writing transistor Tr1 through the other contact. Thus, reliability of the image display device 1 is able to be improved more than in the past.

(3) Effect of the Embodiment

As described above, in this embodiment, in the case that the signal line is formed from the wiring pattern layer different from that of the scanning line only in the region where the signal line intersects with the scanning line, and the signal line is formed from the same wiring pattern layer as that of the scanning line except for the region where the signal line intersects with the scanning line, the wiring pattern that bypasses the intersection region is provided. Thus, a short circuit location between wiring patterns generated in the intersection region is able to be repaired.

Further, by connecting the gate of the writing transistor with the scanning line through the bypass wiring pattern, layout of the pixel circuit is able to be simplified, and further, reliability of the image display device is able to be improved.

2. Second Embodiment

Figure 25:
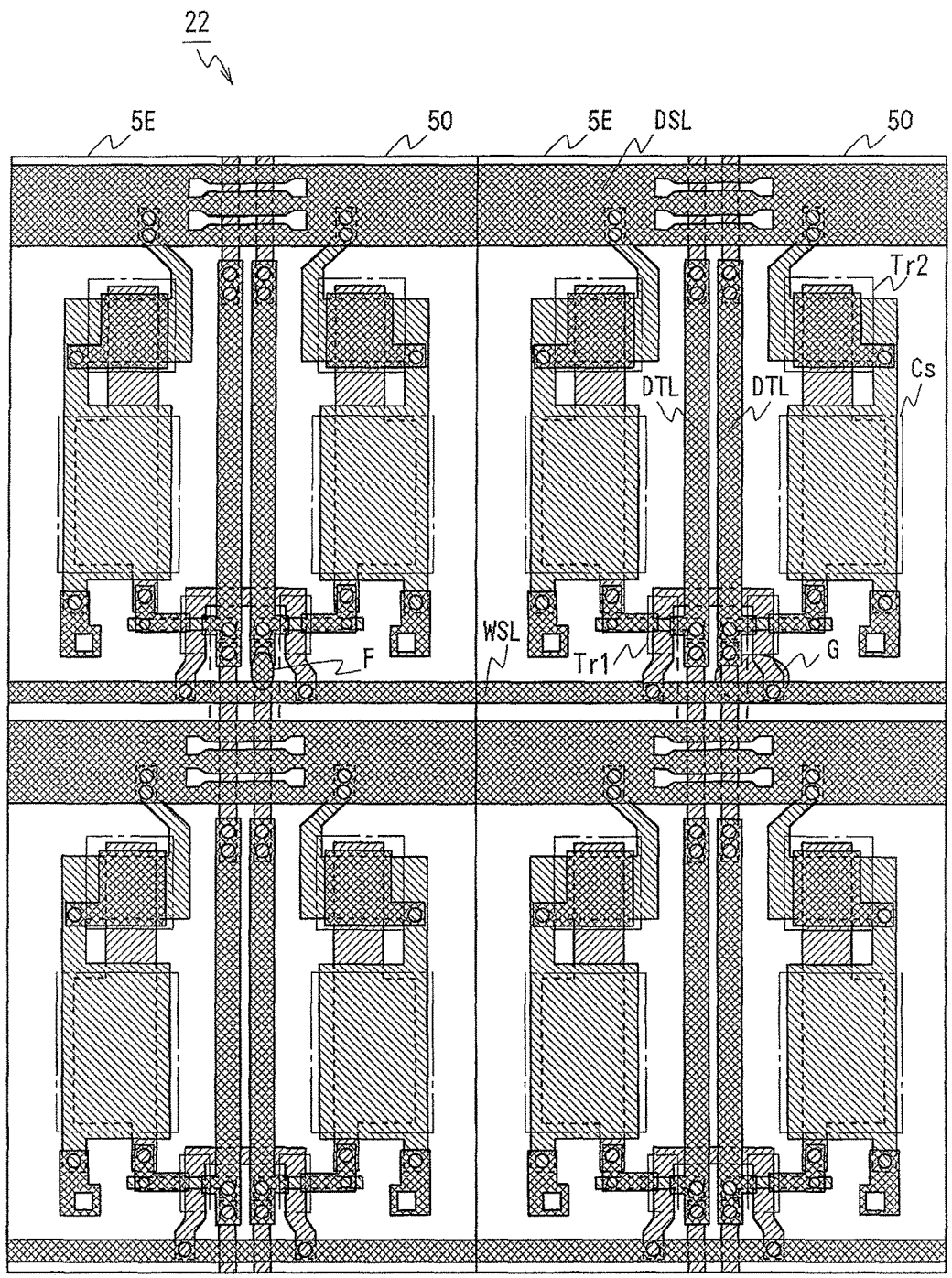
FIG. 25 is a plan view illustrating layout of a pixel circuit applied to an image display device according to a second embodiment of the present invention.

FIG. 25 illustrates layout of a display section applied to an image display device of a second embodiment of the present invention in contrast with FIG. 1. The image display device of this embodiment has the same configuration as that of the image display device 1 of the first embodiment, except that the layout illustrated in FIG. 25 is different from that of the first embodiment. A description will be hereinafter given by using the referential symbols of the respective elements in the image display device in the first embodiment as appropriate.

In the image display device in this embodiment, arrangement is made so that the signal DTL of a pixel circuit 50 in an odd number sequence viewed from the scanning line drive circuit 4 and the signal DTL of an adjacent pixel circuit 5E in an even number sequence viewed from the scanning line drive circuit 4 are opposed to each other. That is, in a display section 22, the signal line DTL is arranged along the left end of the pixel circuit 50 in an odd number sequence, and the signal line DTL is arranged along the right end of the pixel circuit 5E in an even number sequence. Thereby, in the display section 22, the signal lines DTL are closely opposed to each other in the pixel circuits 5E and 50 adjacent to each other.

In this embodiment, the pixel circuit 50 in an odd number sequence and the pixel circuit 5E in an even number sequence are symmetrical to each other centering on the signal lines DTL, and thereby arrangement is made so that the signal lines DTL are closely opposed to each other in the pixel circuits 5E and 50 adjacent to each other.

In the display section 22, in the closely arranged signal lines DTL, a bypass wiring pattern is commonly arranged. That is, in the display section 22, on the scanning drive circuit 4 side and on the opposite side of the scanning drive circuit 4 side located apart from the region where the closely arranged signal lines DTL respectively intersect with the scanning line WSL by distance sufficient for laser trimming, the first contact and the second contact are provided. In the display section 22, a bypass wiring pattern for connecting the first contact section with the second contact section is formed from the first wiring 10A to pass over a layer under the two opposed signal lines DTL all together. The writing signal WS is supplied to the respective writing transistors Tr1 of adjacent pixel circuits by the bypass wiring pattern.

Figure 26:
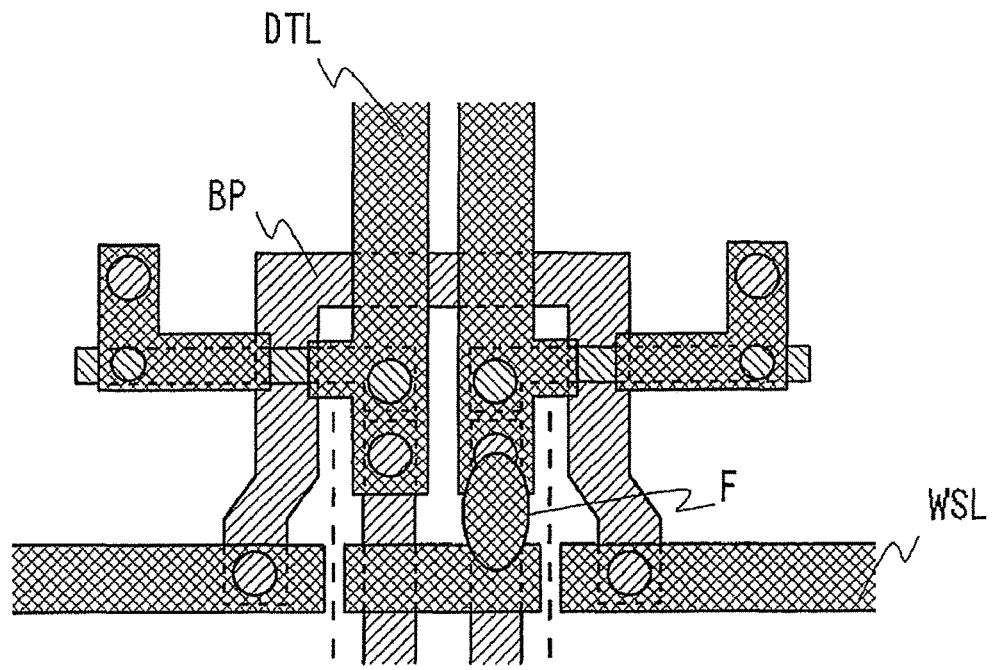
FIG. 26 is a plan view for explaining repair process in the pixel circuit of FIG. 25.
Figure 27:
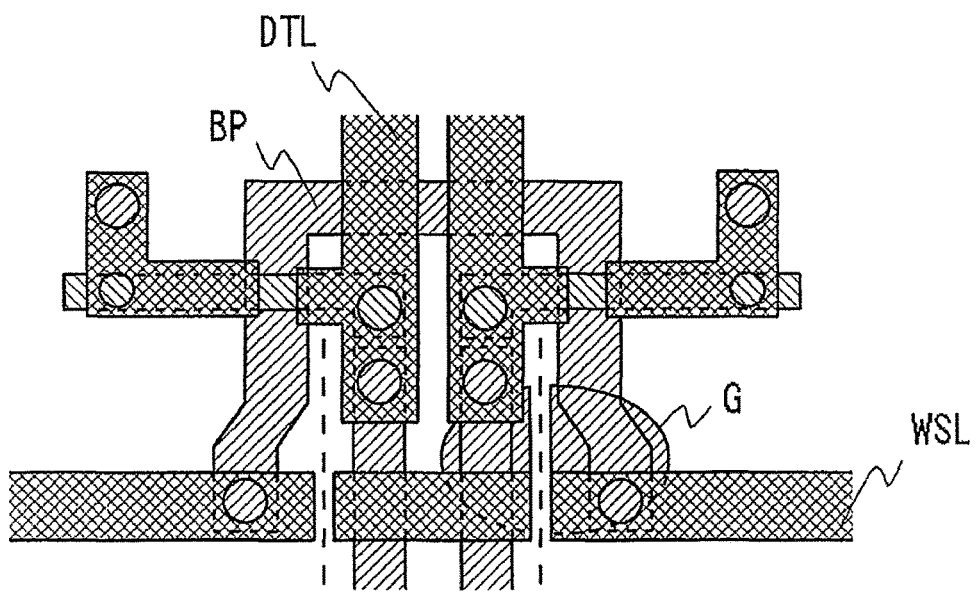
FIG. 27 is a plan view for explaining repair process in an example different from FIG. 26.
Figure 28:
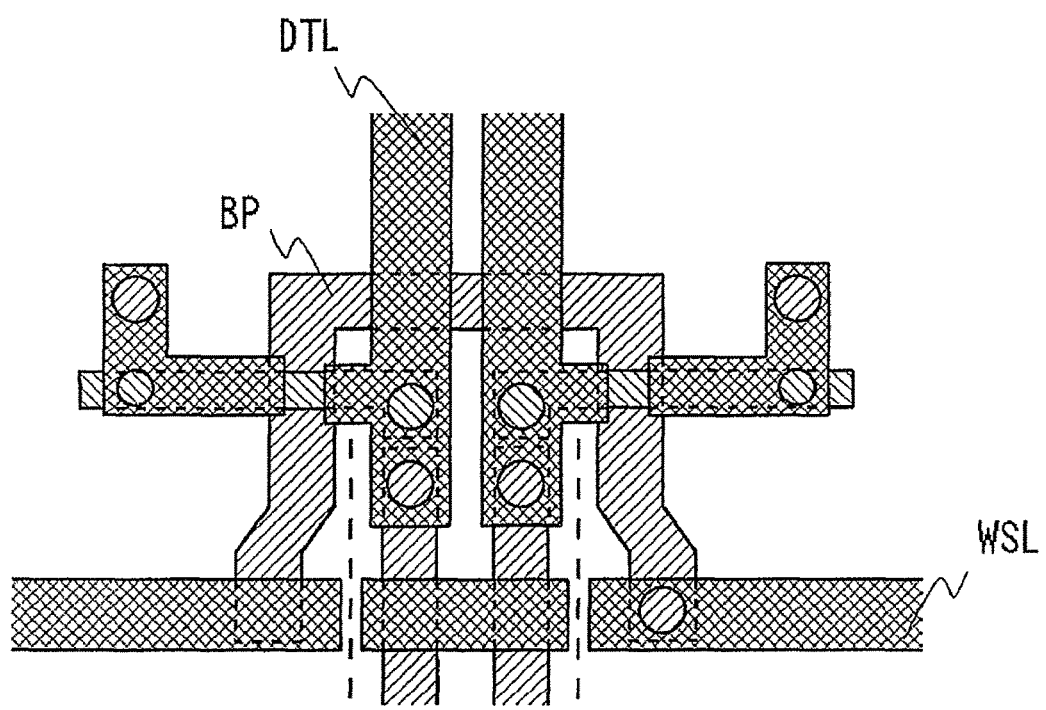
FIG. 28 is a plan view for explaining contact failure.

As illustrated in FIG. 26 and FIG. 27 in contrast with FIG. 19 and FIG. 20, according to the image display device of this embodiment, even if a short circuit failure occurs between the scanning line and the signal line respectively in the first wiring 10A and the second wiring 10B, the short circuit location is able to be securely repaired. Further, as illustrated in FIG. 28, even if one of the first contact and the second contact loses conductivity, the writing signal WS is able to be supplied to the writing transistor Tr1 through the other contact. Thus, reliability of the image display device 1 is able to be improved more than in the past.

According to this embodiment, arrangement is made so that the scanning lines are closely opposed to each other in pixel circuits adjacent to each other, and the bypass wiring pattern is used commonly. Thus, the configuration is able to be simplified more than the configuration of the first embodiment, and effect similar to that of the first embodiment is able to be obtained.

[Further, the pixel circuit in an odd number sequence and the pixel circuit in an even number sequence are symmetrical to each other centering on the scanning lines, and thereby arrangement is made so that the scanning lines are closely opposed to each other in the pixel circuits adjacent to each other. Thereby, the respective pixel circuits are able to be arranged simply by mask mirroring. Thus, the image display is configured easily. Accordingly, with the use of the configuration simplified more than the configuration of the first embodiment, effect similar to that of the first embodiment is able to be obtained.

3. Third Embodiment

Figure 29:
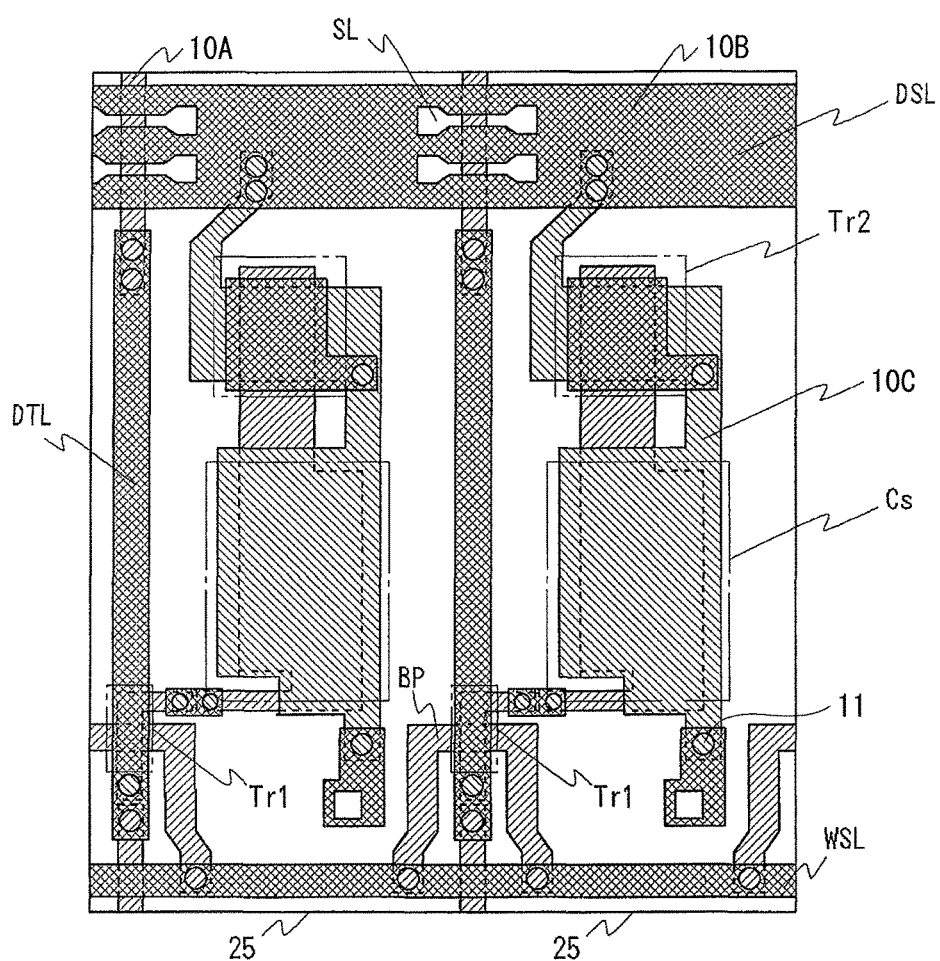
FIG. 29 is a plan view illustrating layout of a pixel circuit applied to an image display device according to a third embodiment of the present invention.

FIG. 29 illustrates layout of a display section applied to an image display device of a third embodiment of the present invention in contrast with FIG. 1. The image display device of this embodiment has the same configuration as that of the image display device 1 of the first embodiment, except that the layout illustrated in FIG. 29 is different from that of the first embodiment.

In a pixel circuit 25 applied to this embodiment, the writing transistor Tr1 is arranged under the second wiring 10B of the signal line DTL. More specifically, the writing transistor Tr1 in the pixel circuit 5 of FIG. 1 is rotated 90 deg counterclockwise, and is arranged under the second wiring 10B of the signal line DTL. Since the layout of the drive transistor Tr2 is changed, in the pixel circuit 25, shape of the retentive capacity CS or the like is modified.

In the image display device of this embodiment, the configuration in which part of the signal line DTL is formed from the second wiring 10B is effectively used, and thereby incident light to the writing transistor Tr1 is able to be blocked by the signal line DTL of the second wiring 10B. The light blocked by the signal line DTL is light of the organic EL device 8 provided in the relevant pixel circuit, light of the organic EL device 8 provided in an adjacent pixel circuit and the like. Thereby, in this embodiment, characteristics change of the writing transistor Tr1 due to entrance of external light is able to be prevented, and various abnormalities due to the characteristics change are able to be prevented. Further, the writing transistor Tr1 is able to be shielded by the signal line DTL, and leak current of back channel is able to be decreased.

According to this embodiment, the drive transistor is arranged under the signal line. Thereby, characteristics change of the drive transistor due to entrance of external light is prevented, and effects similar to that of the foregoing first embodiment are able to be obtained.

4. Fourth Embodiment

Figure 30:
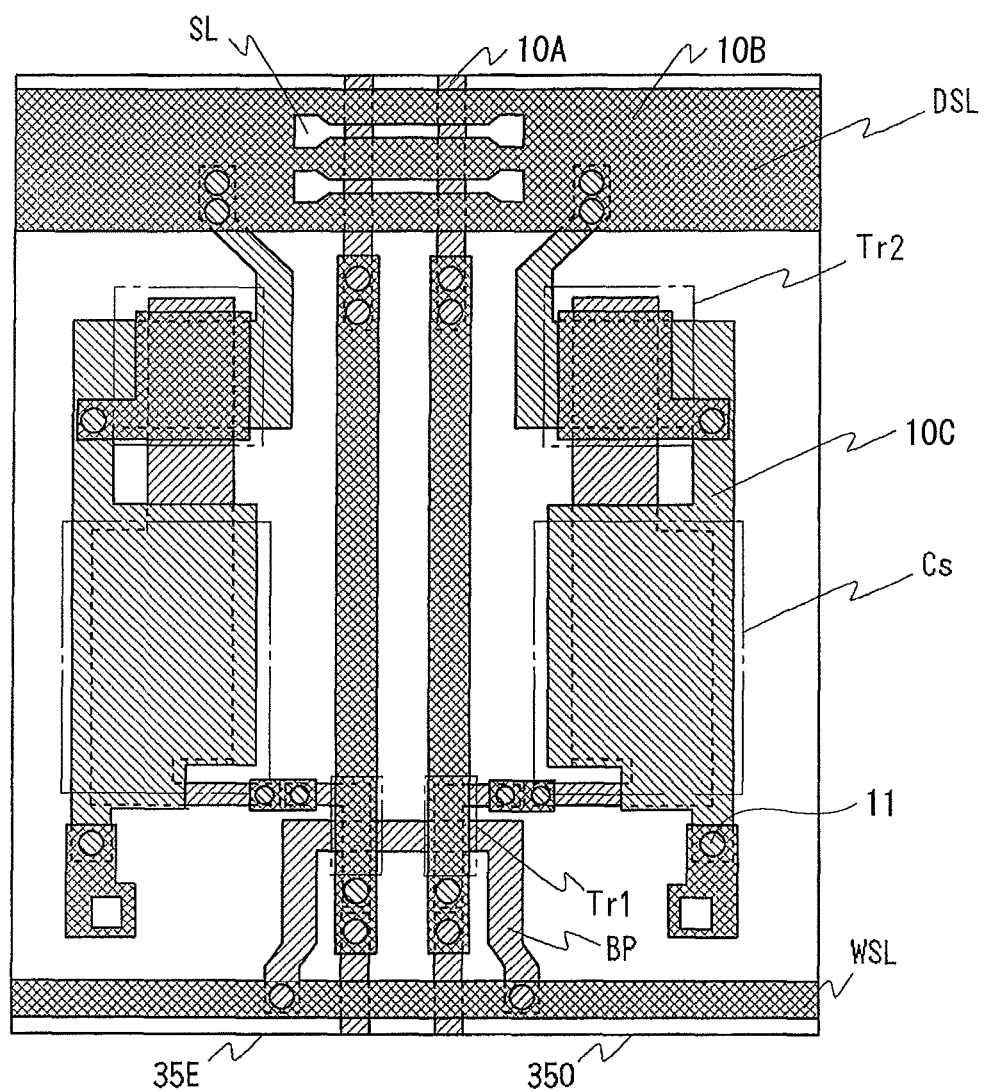
FIG. 30 is a plan view illustrating layout of a pixel circuit applied to an image display device according to a fourth embodiment of the present invention.

FIG. 30 illustrates layout of a display section applied to an image display device of a fourth embodiment of the present invention in contrast with FIG. 25. The image display device of this embodiment has the same configuration as that of the image display device 1 of the second embodiment, except that the writing transistor Tr1 is arranged under the second wiring 10B of the signal line DTL in the same manner as that described for FIG. 29 in contrast with FIG. 1

According to this embodiment, even in the case where the drive transistor is arranged under the signal line to prevent characteristics change of the drive transistor due to entrance of external light and the like in the configuration in which the pixel circuits are symmetrical to each other and the bypass wiring pattern is used commonly, effect similar to that of the foregoing second and third embodiments is able to be obtained.

5. Fifth Embodiment

In the foregoing embodiments, the description has been given of the case that the signal line is arranged on the lower layer side in the region where the signal line intersects with the scanning lines for the power source/for the writing signal. However, the present invention is not limited thereto, and the scanning line side may be arranged in a layer under the signal line.

Further, in the foregoing embodiments, the description has been given of the case that the second wiring 10B is preferentially used to arrange the signal line and the scanning line since the resistance value of the second wiring 10B is lower than that of the first wiring 10A. However, the present invention is not limited thereto. For example, in the case where the resistance value of the first wiring 10A is lower than that of the second wiring 10B, the first wiring 10A may be preferentially used to arrange the signal line and the scanning line. In this case, the present invention is applicable widely as well.

Further, in the second embodiment and the fourth embodiment, the description has been given of the case that the pixel circuit in an odd number sequence and the pixel circuit in an even number sequence are symmetrical to each other. However, the present invention is not limited thereto. It is possible that a red subpixel, a green subpixel, and a blue subpixel composing one pixel of a color image are used as a unit, and such a subpixel is symmetrically formed selectively. In this case, for example, out of pixel circuits respectively configuring the red, green, and blue subpixels, the red pixel circuit and the green and blue pixel circuits are symmetrical to each other, the green pixel circuit and the red and blue pixel circuits are symmetrical to each other, or the red and green pixel circuits and the blue pixel circuit are symmetrical to each other.

6. Sixth Embodiment

Sixth embodiment is an example in which, as described above, the red subpixel, the green subpixel, and the blue subpixel composing one pixel of a color image are used as a unit, and such a subpixel is symmetrically formed selectively. In addition, in this case, a description will be given of a unit (set) in which a G (green) pixel circuit is regarded as a first pixel circuit, a B (blue) pixel circuit is regarded as a second pixel circuit, an R (red) pixel circuit is regarded as a third pixel circuit, and these pixel circuits are arranged in parallel in this order. Further, a description will be given of an example in which in this unit, the B pixel circuit as the second pixel circuit and the R pixel circuit as the third pixel circuit are symmetrical to each other.

Figure 31:
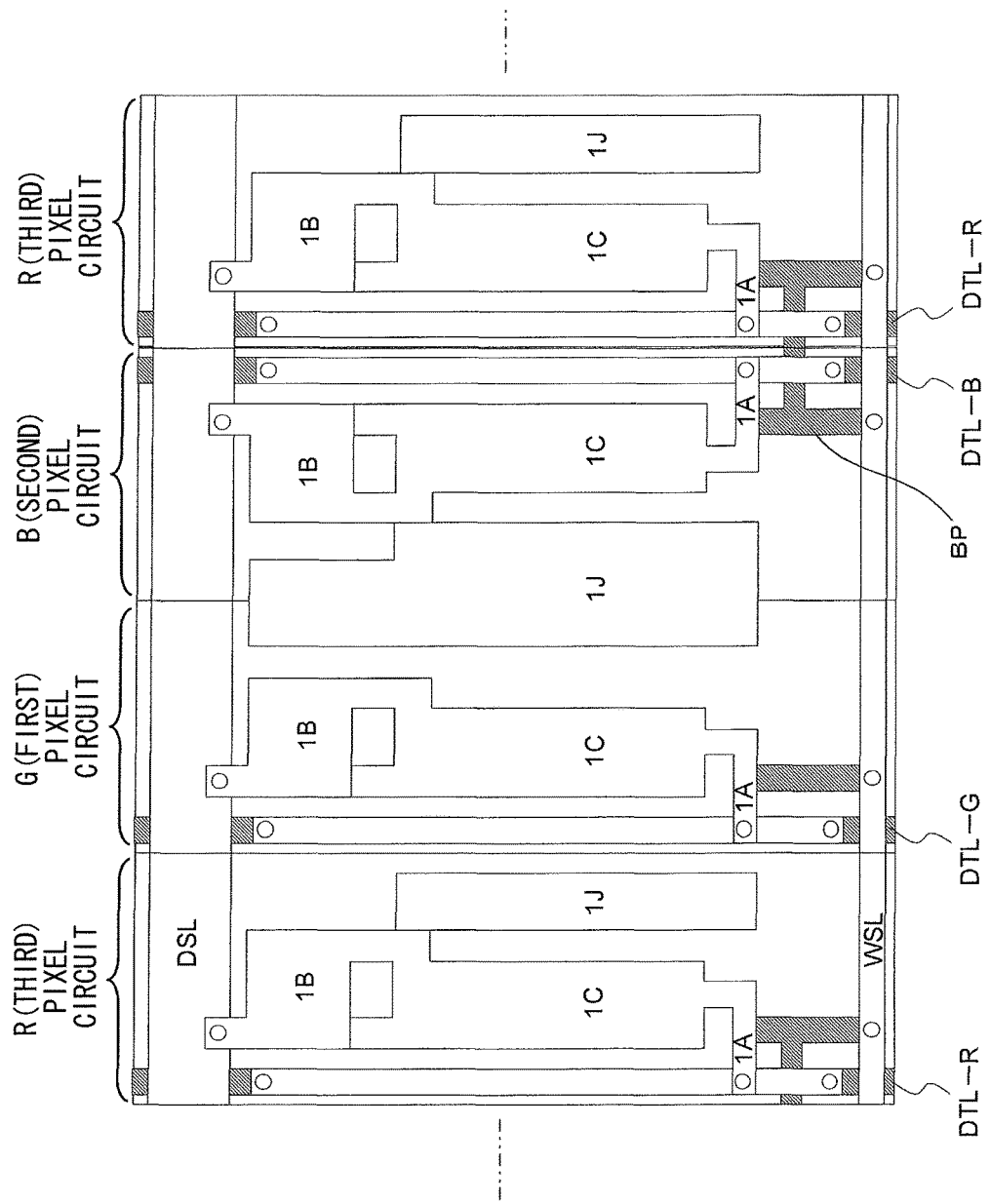
FIG. 31 is a diagram illustrating pattern layout of a pixel circuit as a comparative example of a fifth embodiment of the present invention.

FIG. 31 is a diagram illustrating pattern layout of a pixel circuit as a comparative example in this embodiment. Regarding layout efficiency and defect repair characteristics, in a TFT layer, each pixel pitch is not symmetrical among R, G, and B.

In the layout illustrated in FIG. 31, a case in which the pattern area of the G pixel is smaller than that of the R pixel, and the pattern area of the B pixel is larger than that of the R pixel is shown. Further, among the R, G, and B pixel circuits, the layout of the B pixel circuit is mirror-reversed with respect to the R and G pixel circuits, and thereby each pattern density of R, G, and B is approximately equal to each other.

For the respective B and R pixels, the bypass wiring pattern BP for repairing short circuit between the signal line DTL and the scanning line WSL is formed from a first metal wiring (refer to FIG. 25 to FIG. 28).

That is, the bypass wiring pattern BP that passes over wiring patterns of a signal lines DTL-R and DTL-B in the B and R pixel circuits and that bypasses the region where the signal lines DTL in the B and R pixel circuits intersect with the scanning line WSL all together is provided.

Further, in the G pixel circuit, the bypass wiring pattern BP provided for the B and R pixel circuits is not provided.

Figure 32:
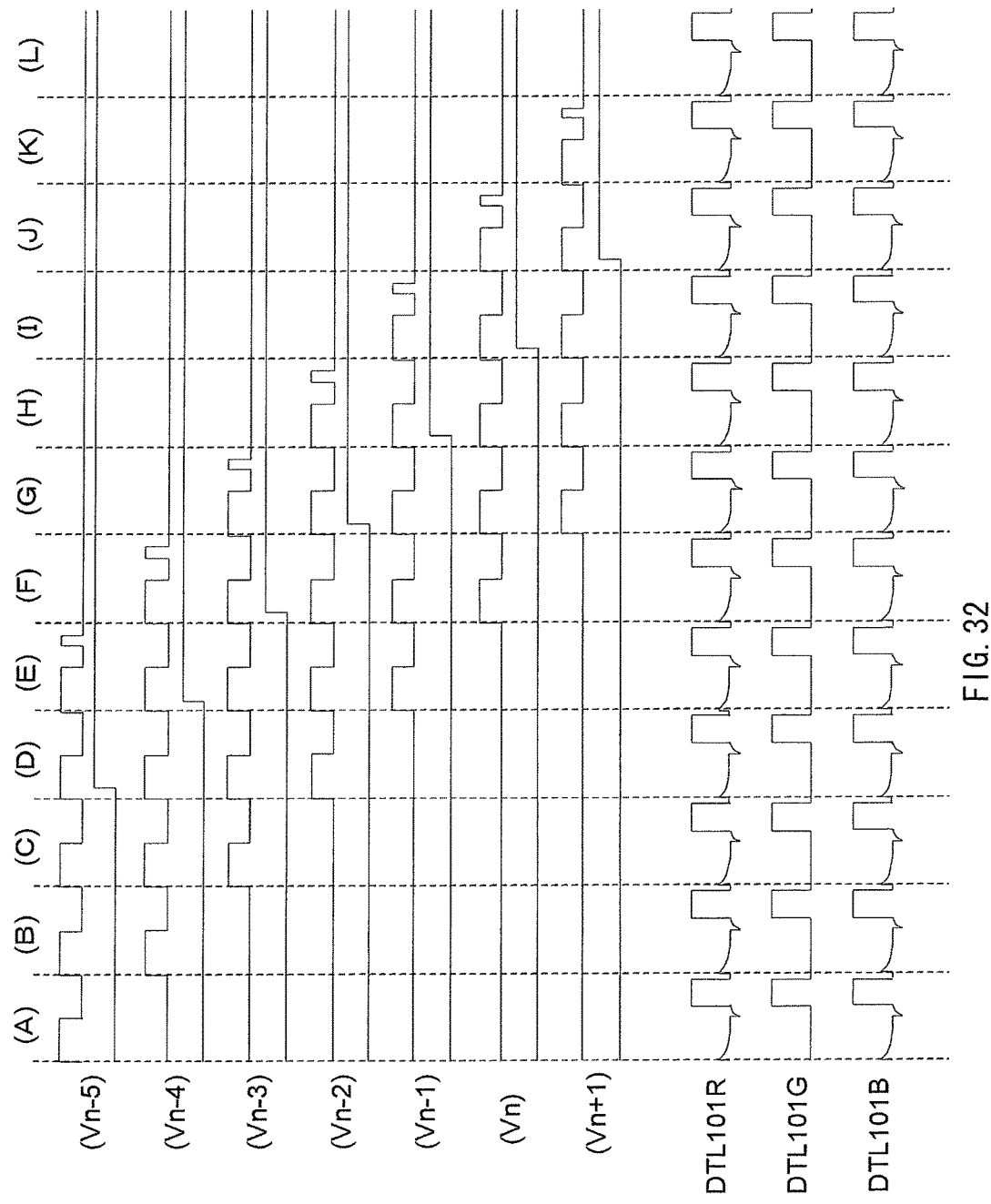
FIG. 32 is a timing chart for several stages in the pixel circuit in the comparative example.

FIG. 32 illustrates a timing chart for several stages in the pixel circuit in the comparative example. In this case, three pulses for WS positive bias and threshold correction preparation and two pulses for threshold correction, that is, switching of the scanning line WSL is executed five times in total.

At this time, in a certain signal line DTL, capacity coupling is generated due to five scanning line switch at the same time. Such number depends on assured image quality, drive frequency and the like. According to the conditions, switching is executed 40 times in total.

Further, FIG. 32 illustrates timing of the respective signal lines DTL-R, DTL-G, and DTL-B of the R, G, and B. In the signal lines DTL-R and DTL-B, parasitic capacity of the signal lines DTL-R and DTL-B and the scanning line WSL is larger than that of DTL-G for the following reason. That is, as the pattern layout illustrated in FIG. 31, the bypass wiring pattern BP is provided for the scanning line WSL in the B and R pixel circuits, and thus parasitic capacity is generated in the section where the signal lines DTL-B and DTL-R intersect with the bypass wiring pattern BP. Accordingly, capacity coupling due to electric potential change of the scanning line WSL in DTL-R and DTL-B is larger than that in DTL-G, and noise is generated in offset electric potential during threshold correction preparation period and threshold correction period.

The foregoing phenomenon is larger as the number of electric potential switching is larger. In particular, in the case where convergence on the video signal reference electric potential Vo is not shown during the threshold correction period, even if the same video signal is inputted, luminance non-uniformity might be caused among the R pixel, the B pixel B, and the G pixel.

Figure 33:
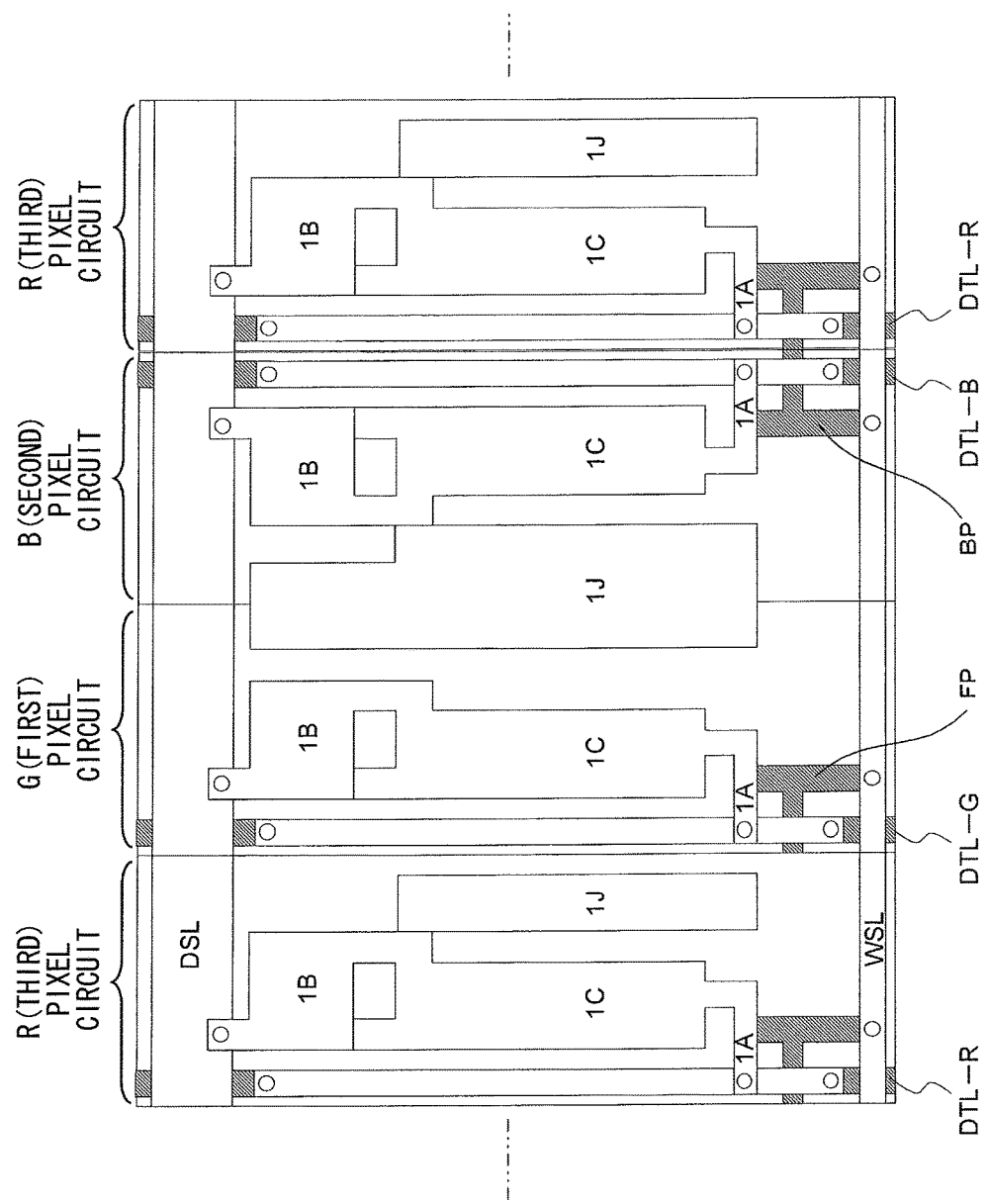
FIG. 33 is a diagram for explaining pattern layout of a pixel circuit according to a sixth embodiment of the present invention.

FIG. 33 illustrates pattern layout of a pixel circuit in this embodiment. Regarding layout efficiency and defect repair characteristics, in a TFT layer, each pixel pitch is not symmetrical among R, G, and B.

In the layout illustrated in FIG. 33, a case in which the pattern area of the G pixel is smaller than that of the R pixel, and the pattern area of the B pixel is larger than that of the R pixel is shown. Further, among the R, G, and B pixel circuits, the layout of the B pixel circuit is mirror-reversed with respect to the R and G pixel circuits, and thereby each pattern density of R, G, and B is approximately equal to each other.

For the respective B and R pixels, the bypass wiring pattern BP for repairing short circuit between the signal line DTL and the scanning line WSL is formed from a first metal wiring (refer to FIG. 25 to FIG. 28).

That is, the wiring pattern BP that passes over the wiring patterns of the signal lines DTL-R and DTL-B in the B and R pixel circuits and that bypasses the region where the signal lines DTL in the B and R pixel circuits intersect with the scanning line WSL all together is provided.

In the G pixel circuit, instead of the bypass wiring pattern BP provided for the B and R pixel circuits, a pseudo wiring pattern FP is provided.

The pseudo wiring pattern FP is a wiring pattern that is conducted to the scanning line WSL, and that passes over the wiring pattern of the signal line DTL-G in an upper layer or a lower layer in a region different from the region where the scanning line WSL intersects with the signal line DTL-G.

Since the foregoing pseudo pattern FP is provided, parasitic capacity is generated between the pseudo pattern FP and the signal line DTL-G in the G pixel circuit. Meanwhile, in the B and R pixel circuits, parasitic capacity is generated between the bypass wiring pattern BP and the signal lines DTL-B and DTL-R. That is, the same parasitic capacity is generated in the all R, G, and B pixel circuits.

Figure 34:
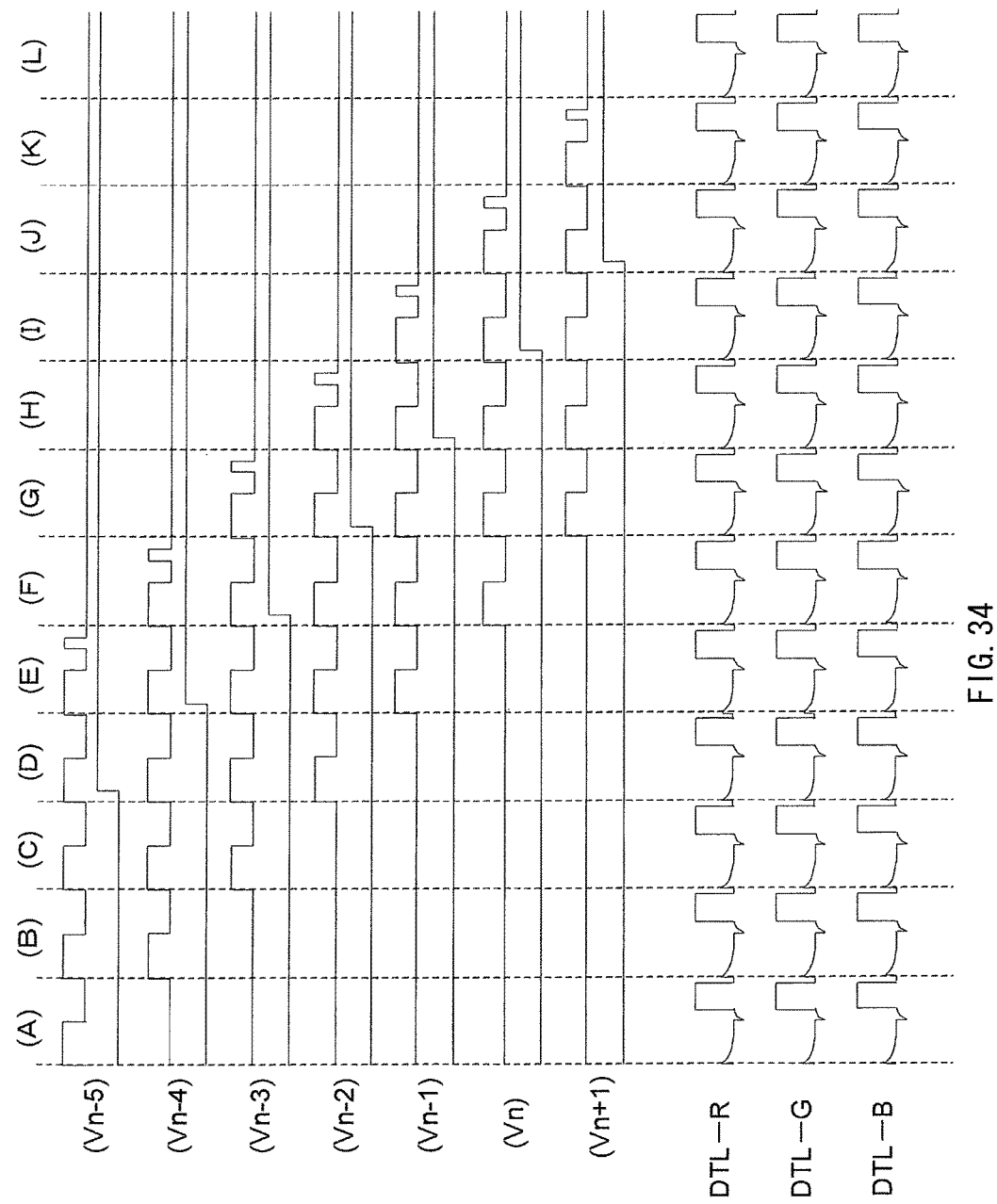
FIG. 34 is a timing chart in the pattern layout of the sixth embodiment.

FIG. 34 illustrates a timing chart in the pattern layout of this embodiment. In this embodiment, capacity coupling amount due to electric potential change of the scanning line WSL is equal, and the same noise is generated in the respective video signal reference electric potentials Vo, and thereby luminance non-uniformity is able to be prevented.

In this embodiment, in the 2Tr1C pixel circuit, the bypass wiring pattern BP is provided for the B and R pixel circuits, and the pseudo wiring pattern FP is provided in the G pixel circuit. Thereby, parasitic capacity formed between the scanning line WSL and the signal line DTL becomes identical for the respective signal lines. Thus, variation of capacity coupling amount due to electric potential change of the scanning line WSL among the respective pixels is able to be decreased, and luminance non-uniformity is able to be prevented.

In the layout pattern of this embodiment illustrated in FIG. 33, a bypass wiring pattern that bypasses the intersection between the scanning line WSL and the signal line DTL-G may be provided instead of the pseudo wiring pattern FP provided in the G pixel circuit.

In the foregoing embodiments, the description has been given of the case that the image display device is composed of the pixel circuit described for FIG. 3. However, the present invention is not limited thereto. The present invention is widely applicable to cases that the image display device is composed of various pixel circuits.

Specifically, for example, in the foregoing embodiments, the description has been given of the case in which the organic EL device side end voltage of the retentive capacity is fallen by falling down the drain voltage of the drive transistor, and thereby the interterminal voltage of the retentive capacity is set to a voltage equal to or greater than the threshold voltage of the drive transistor. However, the present invention is not limited thereto. For example, the present invention is widely applicable to a case in which the organic EL device side end of the retentive capacity is connected to a given fixed voltage through a switching transistor separately, and thereby the interterminal voltage of the retentive capacity is set to a voltage equal to or greater than the threshold voltage of the drive transistor.

Further, in the foregoing embodiments, the description has been given of the case in which the gate voltage of the drive transistor is set to the fixed voltage for correcting the threshold voltage through the signal line, and thereby the interterminal voltage of the retentive capacity is set to a voltage equal to or greater than the threshold voltage of the drive transistor. However, the present invention is not limited thereto. For example, the present invention is widely applicable to a case in which the gate voltage of the drive transistor is set to the fixed voltage through a switching transistor, and thereby the interterminal voltage of the retentive capacity is set to a voltage equal to or greater than the threshold voltage of the drive transistor.

Further, in the foregoing embodiments, the description has been given of the case in which the present invention is applied to the image display device with the use of the self-luminous device composed of the organic EL device. However, the present invention is not limited thereto. The present invention is widely applicable to an image display device with the use of various self-luminous devices, and further to an image display device with the use of liquid crystal or the like.

INDUSTRIAL APPLICABILITY

The present invention is applicable to, for example, an active matrix type image display device with the use of an organic EL device.

The invention claimed is:

1. An image display device comprising:
a pixel, a signal line configured to supply a video data signal to the pixel and extending along a first direction, a first scanning line extending along a second direction, and a second scanning line extending in the second direction,
wherein the pixel includes a first transistor, a second transistor, a capacitor, and a light emitting element,
wherein the first transistor is configured to connect the signal line to the capacitor according to a scan signal supplied through the first scanning line,
wherein the second transistor is configured to supply a driving current to the light emitting element,
wherein the second scanning line has a plurality of slits,
wherein at least one of the slits overlaps with the signal line,
wherein the first scanning line includes a bypass line that overlaps the signal line,
wherein the bypass line is formed from a first wiring layer,
wherein the first scanning line is formed from a portion of a second wiring layer, in which the second wiring layer is a different layer from the first wiring layer, and
wherein the bypass line is connected to the portion of the second wiring layer through a first contact and a second contact which are disposed on opposite sides of the signal line.

2. The image display device according to claim 1, wherein each of the slits extends along the second direction.

3. The image display device according to claim 2, wherein at least two of the slits extend in parallel and adjacent to each other in the first direction.

4. The image display device according to claim 1, wherein the plurality of the slits overlap with the signal line.

5. The image display device according to claim 1, wherein the second scanning line is configured to supply the driving current to the light emitting element via the second transistor.

6. The image display device according to claim 1, wherein a gate of the first transistor is connected to the bypass line of the first scanning line.

7. An image display device comprising:
a plurality of pixels, signal lines configured to supply video data signals to the pixels and extending along a first direction, a plurality of first scanning lines extending along a second direction that is perpendicular to the first direction, and a plurality of second scanning lines extending in the second direction,
wherein each of the pixels includes a first transistor, a second transistor, a capacitor, and a light emitting element,
wherein, within each of the pixels, the first transistor is configured to connect a corresponding one of the signal lines to the capacitor according to a scan signal supplied through a corresponding one of the first scanning lines, and the second transistor is configured to supply a driving current to the light emitting element,
wherein each of the second scanning lines has a plurality of slits respectively overlapping with a corresponding one of the signal lines,
wherein each of the first scanning lines includes a bypass line that overlaps the corresponding one of the signal lines,
wherein the pixels are arranged in a matrix,
wherein the pixels include a first pixel belonging to a first column of the matrix and a second pixel belonging to a second column of the matrix, the first column and the second column being adjacent each other,
wherein a circuit layout of the first pixel and a circuit layout of the second pixel are symmetrical to each other with respect to an axis along the first direction, and
wherein, within the circuit layout of each of the first pixel and the second pixel circuit, the first transistor is closer to the corresponding one of the first scanning lines than the second transistor.

8. The image display device according to claim 7, wherein each of the slits in each of the second scanning lines extends along the second direction.

9. The image display device according to claim 7, wherein each of the bypass lines is on a different layer than a layer on which the first scanning lines are formed.

10. The image display device according to claim 7, wherein the second scanning lines are configured to supply the driving current to the light emitting elements respectively via the second driving transistors.

11. The image display device according to claim 7, wherein the signal lines include a first signal line connected to the first pixel and a second signal line connected to the second pixel, and
one of the slits overlaps with the both of the first signal line and the second signal line.

12. The image display device according to claim 11, wherein the first signal line and the second signal line are disposed so as to be adjacent each other between the first pixel and the second pixel.

13. The image display device according to claim 7, wherein, for each of the pixels, a gate of the first transistor is connected to the bypass line of the corresponding one of the first scanning lines.

* * * * *